(12) United States Patent
Pylnev et al.

(10) Patent No.: US 11,313,670 B2
(45) Date of Patent: Apr. 26, 2022

(54) INSPECTION METHOD FOR MULTILAYER SEMICONDUCTOR DEVICE

(71) Applicant: National Tsing Hua University, Hsinchu (TW)

(72) Inventors: Mikhail Pylnev, Hsinchu (TW); Tzu-Chien Wei, Hsinchu (TW); Duc-Anh Le, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 101 days.

(21) Appl. No.: 17/037,981

(22) Filed: Sep. 30, 2020

(65) Prior Publication Data

US 2022/0099432 A1    Mar. 31, 2022

(51) Int. Cl.
| | | |
|---|---|---|
| *G01B 11/06* | (2006.01) | |
| *H01L 21/66* | (2006.01) | |
| *H01G 9/20* | (2006.01) | |

(52) U.S. Cl.
CPC .............. *G01B 11/06* (2013.01); *H01L 22/12* (2013.01); *G01B 2210/56* (2013.01); *H01G 9/2068* (2013.01)

(58) Field of Classification Search
CPC ....................................................... G01B 11/06
USPC ............................................................ 356/632
See application file for complete search history.

(56) References Cited

U.S. PATENT DOCUMENTS

| | | | | |
|---|---|---|---|---|
| 5,503,707 | A * | 4/1996 | Maung | C23C 14/547 438/8 |
| 8,580,077 | B2 * | 11/2013 | Ogasawara | H01J 37/32935 156/345.24 |
| 2010/0093260 | A1 * | 4/2010 | Kobayashi | B24B 49/12 451/6 |
| 2015/0364686 | A1 * | 12/2015 | Maehara | H01L 51/0003 438/99 |
| 2019/0095797 | A1 * | 3/2019 | Dhandapani | B24B 37/32 |

* cited by examiner

*Primary Examiner* — Tarifur R Chowdhury
*Assistant Examiner* — Omar H Nixon
(74) *Attorney, Agent, or Firm* — Li & Cai Intellectual Property (USA) Office

(57) ABSTRACT

An inspection method for a multilayer semiconductor device is provided. The inspection method can investigate multi-layered ensembles of a multilayer semiconductor device and obtain stratigraphic thickness (ST) maps of each layer in the multilayer semiconductor device by utilizing absorption edges of materials of interests and obtaining calibration quality curves.

17 Claims, 23 Drawing Sheets

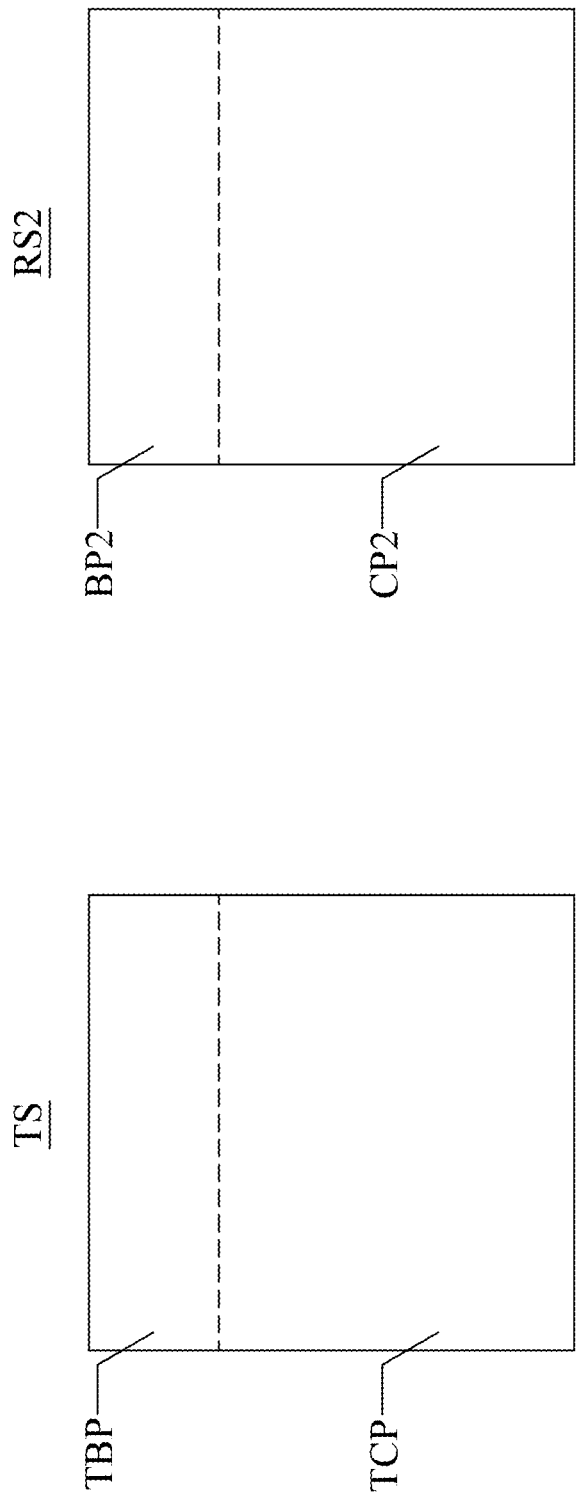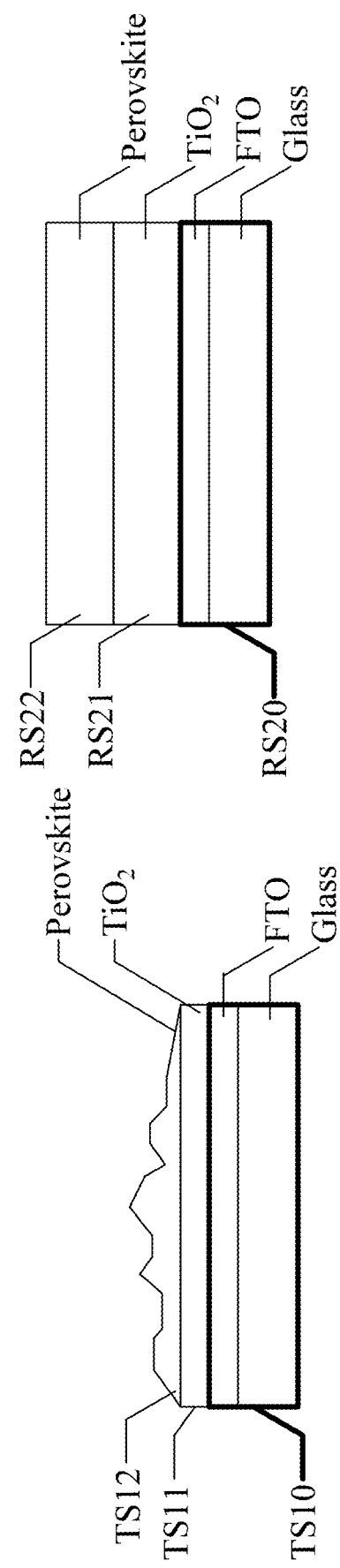
FIG. 11A
FIG. 11B

INSPECTION METHOD FOR MULTILAYER SEMICONDUCTOR DEVICE

FIELD OF THE DISCLOSURE

The present disclosure relates to an inspection method for a multilayer semiconductor device, and more particularly to an inspection method for a multilayer semiconductor device that can investigate multilayered ensembles of a multilayer semiconductor device and obtain stratigraphic thickness (ST) maps of each layer in the multilayer semiconductor device.

BACKGROUND OF THE DISCLOSURE

Organic-inorganic lead halide perovskite material-based solar cells are affordable and relatively simple to manufacture. They possess unique intrinsic properties like broad absorption spectra, fast charge separation, long diffusion distance of charge carriers, and long carrier separation lifetime, making them a competitive solar cell technology to furnish low cost solar electricity.

A perovskite solar cell (PSC) may include an FTO layer on glass, a $TiO_2$ layer, a perovskite layer, an HTM layer (e.g., Spiro-OMeTAD), and a gold contact. There are various manufacturing processes to form functional layers of a PSC. During manufacturing of the PSC, it is probable that uniformity of one or more layers is poor, or/and they have pinholes or/and parasitic phases which lead to a failure of the device or low PCE (Photoconversion efficiency) of the PSC.

SUMMARY OF THE DISCLOSURE

In response to the above-referenced technical inadequacies, the present disclosure provides an inspection method for a multilayer semiconductor device that can investigate multilayered ensembles of the multilayer semiconductor device and obtain stratigraphic thickness (ST) maps of each layer in the multilayer semiconductor device.

In one aspect, the present disclosure provides an inspection method for a multilayer semiconductor device, including: preparing a test sample of the multilayer semiconductor device including a test substrate including a test covered portion and a test bare portion and a first test layer disposed on the test substrate in the test covered portion, in which the first test layer is made of a first material of interest; preparing a plurality of first reference samples, in which each of the plurality of first reference samples includes a first reference substrate having a first covered portion and a first bare portion and a first layer disposed on the first reference substrate in the first covered portion, in which the first layer is made of the first material of interest; choosing a first region of wavelength corresponding to an absorption edge of the first material of interest; performing a first calibration process for each of the first reference samples to obtain a plurality of first quality values and a plurality of first thicknesses corresponding to the plurality of first quality values, and the first calibration process includes: measuring a thickness of the first layer as one of the plurality of first thickness; measuring transmittances of the first covered portion and the first bare portion, to obtain first transmittances of the first covered portion and first bare transmittances of the first bare portion at the first region of wavelength; and calculating an average ratio of the first transmittances to the first bare transmittances as one of the plurality of first quality values. The inspection method further includes: applying a linear approximation to obtain a first calibration function of the first thickness according to the plurality of first quality values and the plurality of first thicknesses; measuring a transmittance of the test bare portion of the test sample, to obtain a test bare transmittance of the test bare portion at the first region of wavelength; performing an inspection process for each of a plurality of test points in the test covered portion of the test sample to obtain a plurality of first inspection thicknesses, in which the inspection process includes: measuring a transmittance of the test covered portion with the light source emitting lights at the first region of wavelength, to obtain a first test transmittance of the test covered portion; calculating a ratio of the first test transmittance to the test bare transmittance as a first test quality value; determining whether the test first quality value within a first predetermined range; in response to the first test quality value being determined within the first predetermined range, mapping the first test quality value to the first calibration function to obtain the first thickness corresponding to the first test quality value as one of the first inspection thicknesses.

Therefore, the inspection method for the multilayer semiconductor device provided by the present disclosure may investigate multilayered ensembles of the semiconductor device, and obtain stratigraphic thickness (ST) maps of each layer in the multilayer semiconductor device that may be used to measure uniformity of an interface between two layers in ensembles and thicknesses of separate layers by using calibration functions, detect missing layer(s), find dust particles on the surface and inside the ensembles, detect and locate parasitic phases, absorption edges in the spectral curves are not affected by the optical interference effects.

Furthermore, by utilizing absorption edges of materials of interest, precise measurements for extremely thin films (~10 nm) may be achieved, the calibration function for a specific layer can be used for another substrate, and since small shifts in absorption edges may be detected, compositional analysis may then be performed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 11A shows top and side views of the test sample according to the second embodiment.

FIG. 11B shows top and side views of one of the plurality of second reference samples according to the second embodiment.

DETAILED DESCRIPTION OF THE EXEMPLARY EMBODIMENTS

The present disclosure is more particularly described in the following examples that are intended as illustrative only since numerous modifications and variations therein will be apparent to those skilled in the art.

Figure 1A:
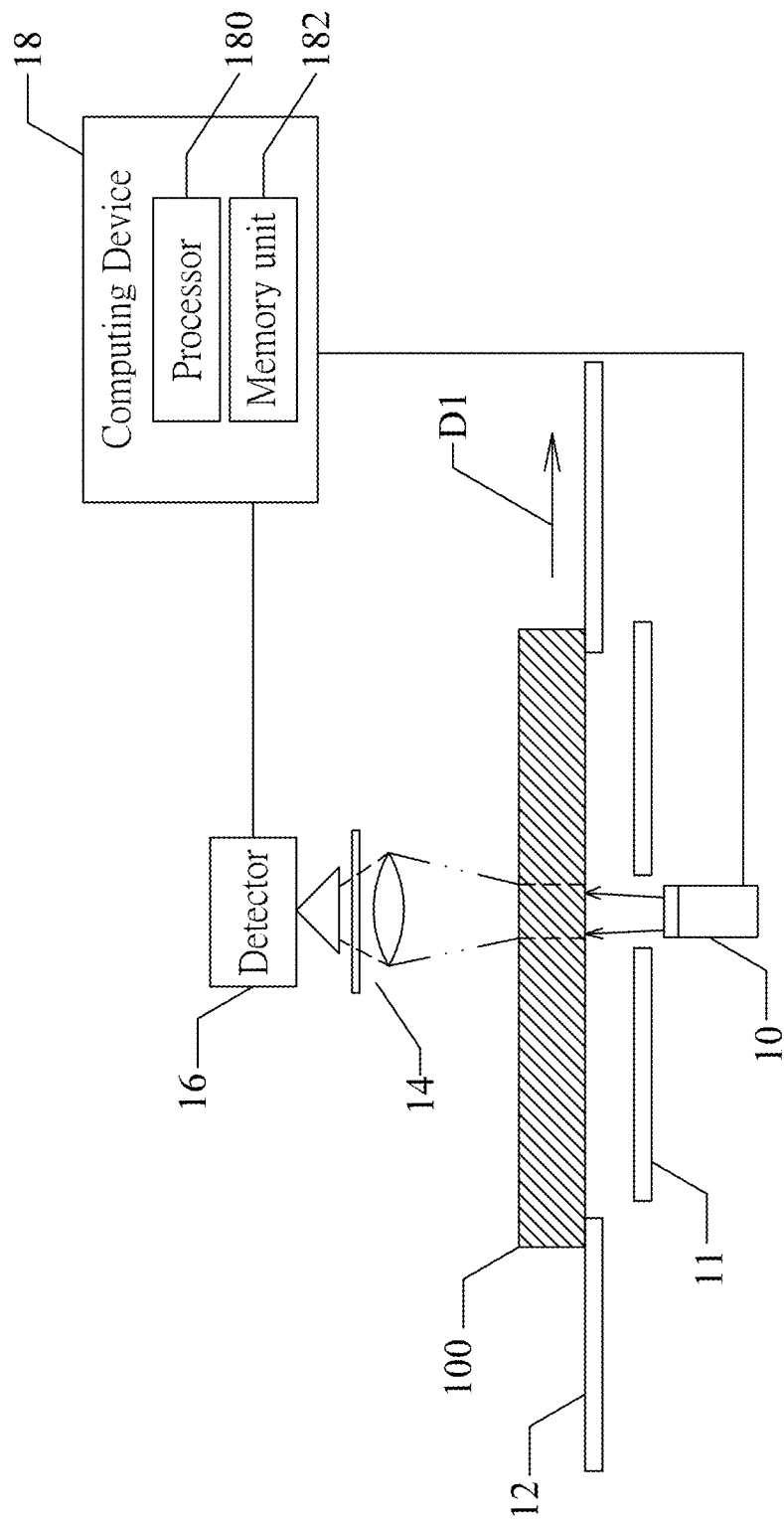
FIG. 1A is a schematic view of an inspection system according to a first embodiment.

FIG. 1A is a schematic view of an inspection system according to a first embodiment of the present disclosure. The inspection system includes a light source 10, a sample holder 12, an optical module 14, a slit 11, a detector 16 and a computing device 18.

The light source 10 may be a white light source, which can produce non-polarized, incoherent white light directed onto a sample 100 of a multilayer semiconductor device.

Figure 1B:
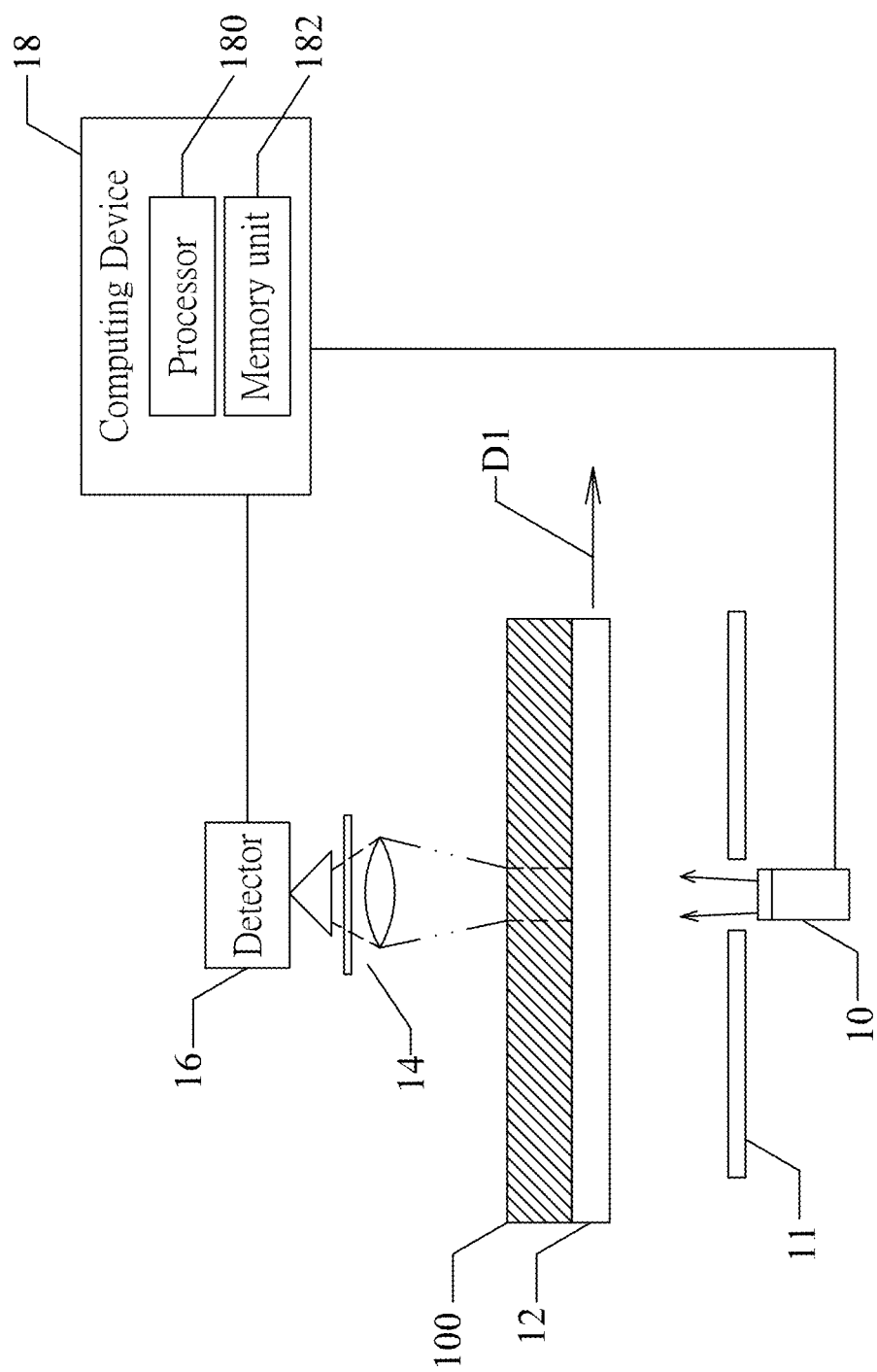
FIG. 1B is a schematic view of an inspection system according to another embodiment.

Further, the sample holder 12 may be an XY table, which is configured to move together with the sample 100 along specific directions (e.g., a direction D1 shown in FIG. 1) to conduct measurements at different regions in the sample based on a high precision stepper motor that allows precise positioning with a small step (e.g., few micrometers). In another example, as shown in FIG. 1B, the sample 100 is placed on the sample holder 12, and the sample holder 12 is made of transparent material, e.g., quartz, so as not to interfere with the absorbance by the sample 100.

The optical module 14 may include lens for concentrating transmission lights from the sample 100 and diffraction gratings for dispersing the concentrated lights. The detector 16 may include one or more charge coupled device (CCD) spectrometer, which is configured to collect lights transmitted from the sample 100 and concentrated and dispersed by the optical module 14, thereby measuring a transmittance of the sample 100 at specific wavelengths after intensities of the collected lights are calculated by the computing device 18.

In an embodiment, the computing device 18 is connected to and configured to control the light source 10 and the detector 16. The computing device 18 may include a processor 180 and a memory unit 182. The processor 180 serves to execute instructions for software or firmware that may be loaded into the memory unit 182. The processor 180 may be a set of one or more processors or may be a multi-processor core, depending on the particular implementation.

Further, the memory unit 182 can take various forms depending on the particular implementation. For example, the memory unit 182 may contain one or more components or devices. For example, the memory unit 182 may be a hard drive, a flash memory, a rewritable optical disk, a rewritable magnetic tape, or any combination thereof. The media used by the memory unit 182 also may be removable. For example, a removable hard drive may be used as the media for the memory unit 182. Moreover, the memory unit 182 can be configured to store software or firmware for the processor 180 to control the light source 10 and the detector 16, and processing data corresponding to the intensities of lights collected by the detector 16.

In the following descriptions, the present disclosure further provides an inspection method for a multilayer semiconductor device that can investigate multilayered ensembles of the multilayer semiconductor device and obtain stratigraphic thickness (ST) maps of each layer in the multilayer semiconductor device, especially a solar cell. Specifically, the inspection system mentioned above can be utilized to perform the inspection method provided by the present disclosure.

As is now well known, a sudden onset of strong absorption occurs when the photon energy exceeds the band gap energy, and can be used to identify an absorption edge in an absorption curve. Each semiconductor material has a unique absorption edge in an absorption curve that may be described by an exponential function, and this feature in the absorption spectrum allows the semiconductor material to be found and unequivocally identified in an ensemble of a multilayer semiconductor device.

Figure 2:
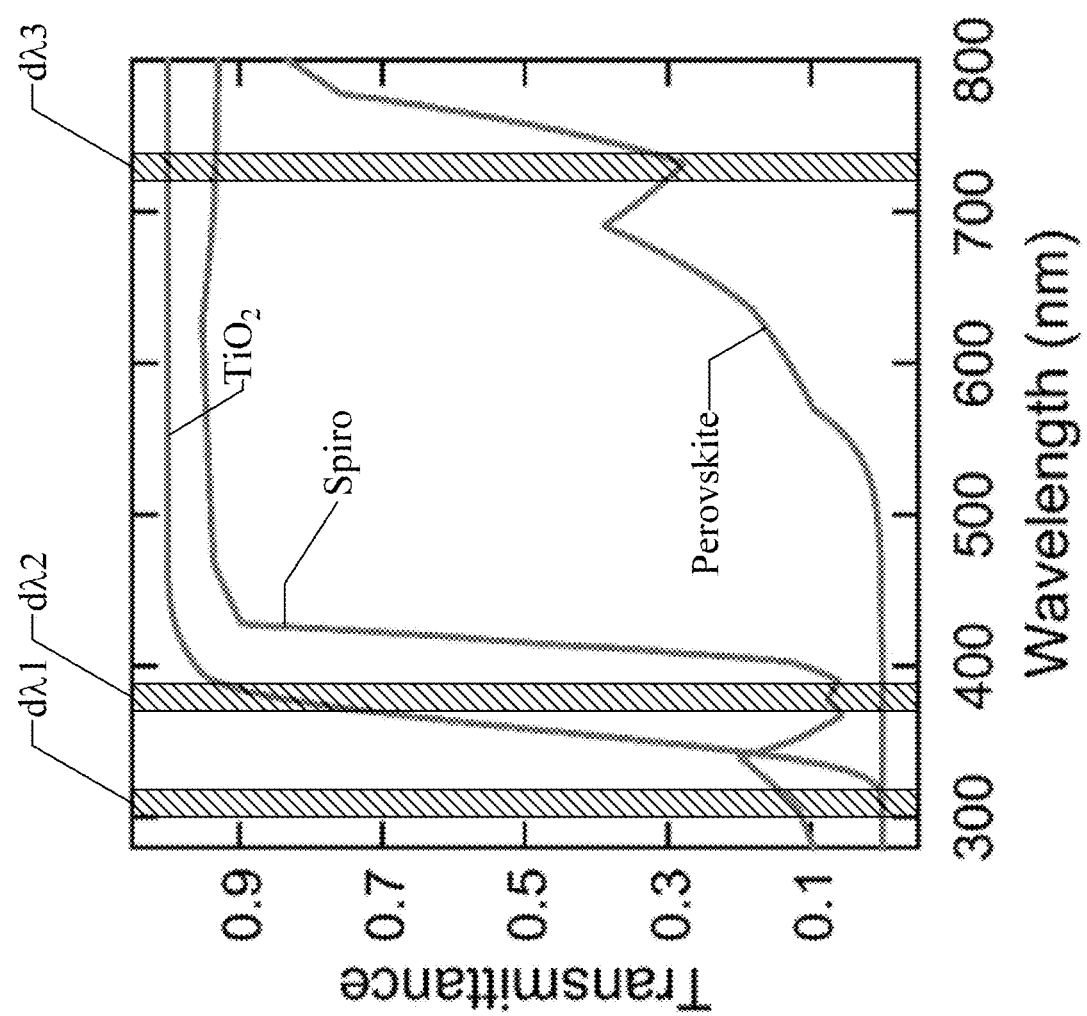
FIG. 2 is a light transmittance spectra of certain materials utilized in perovskite solar cells (PSC).

FIG. 2 is a light transmittance spectra of certain materials utilized in perovskite solar cells (PSC). FIG. 2 shows the light transmittance spectra of $TiO_2$ (as an electron transport material (ETM)), $MAPbI_3$ (as a perovskite material) and Spiro-MeOTAD (as a hole transport material (HTM)), and corresponding absorption edges are shown with regions dλ1, dλ2 and dλ3. As shown, absorbance of the HTM and ETM are zero in a region of absorbance of the perovskite, thus the absorption edges can be distinguished in the absorbance curve of a multilayer semiconductor device having a perovskite material layer.

Furthermore, each of the regions dλ1, dλ2 and dλ3 of wavelength may be chosen in a region that is about 10 to 20 nm lesser than a wavelength of the minimum in the transmittance spectrum corresponding to the absorption edge (a sharp discontinuity in the absorption spectrum of a substance), and the region of wavelength can be calculated by dividing 1,240 (nm*eV) with an energy gap (in eV) of the corresponding material. For example, a region from 330 to 340 nm of wavelength may be chosen for $TiO_2$, as shown in FIG. 2, and the chosen region of wavelength will be used to measure transmittances and establish calibration functions (curves) hereinafter.

First Embodiment

Figure 3:
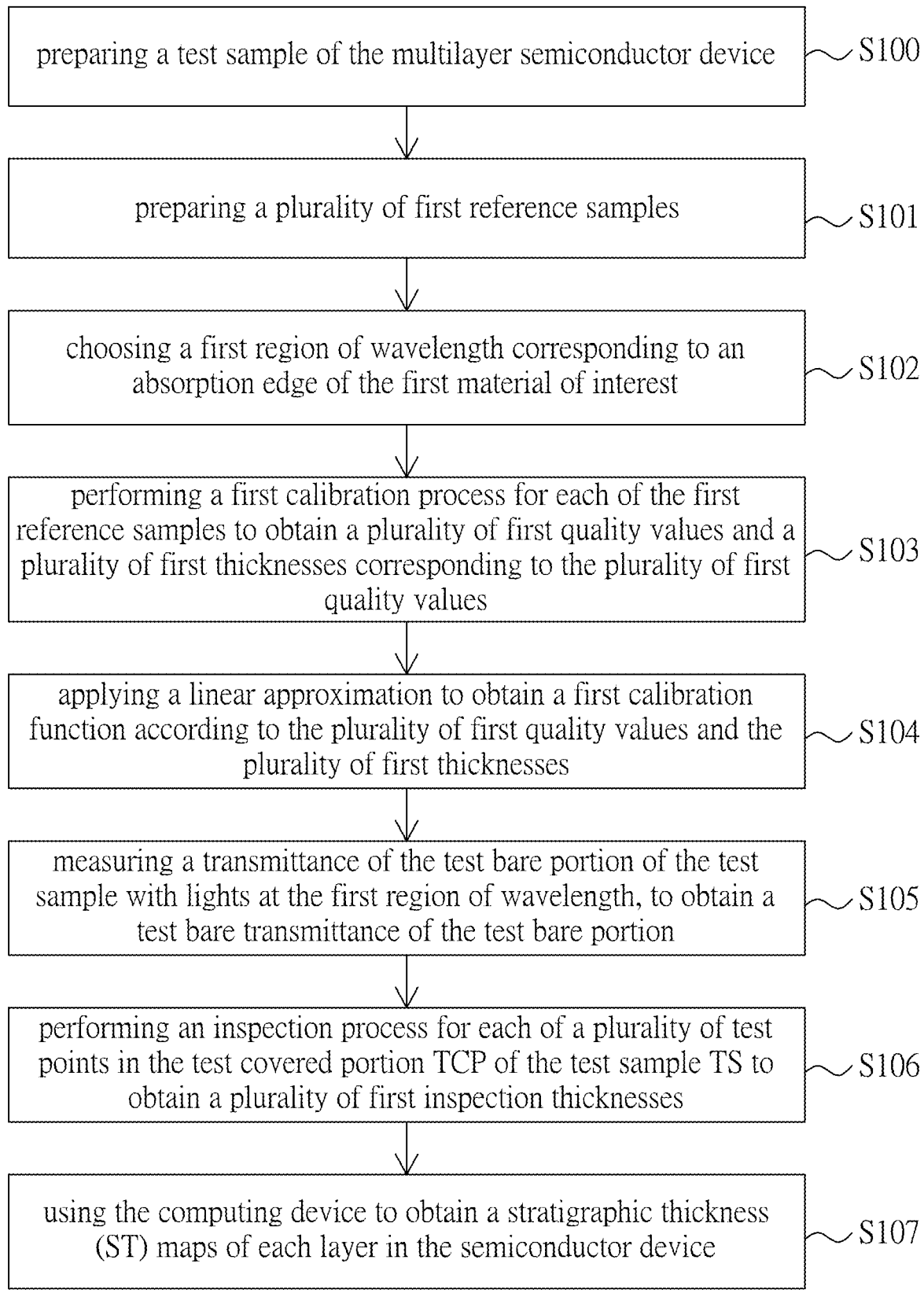
FIG. 3 is a flowchart of an inspection method for a multilayer semiconductor device according to a first embodiment.

FIG. 3 is a flowchart of an inspection method for a multilayer semiconductor device according to a first embodiment of the present disclosure. The first embodiment provides an inspection method applicable to the inspection system described above, and includes the following steps:

Step S100: preparing a test sample TS of the multilayer semiconductor device. It should be noted that the inspection method of the first embodiment can be specifically applied on a multilayer semiconductor device including a structure with only one layer in addition to a conductive glass substrate having a glass layer and a transparent conductor layer, but the present disclosure is not limited thereto.

Figures 4A, 4B:
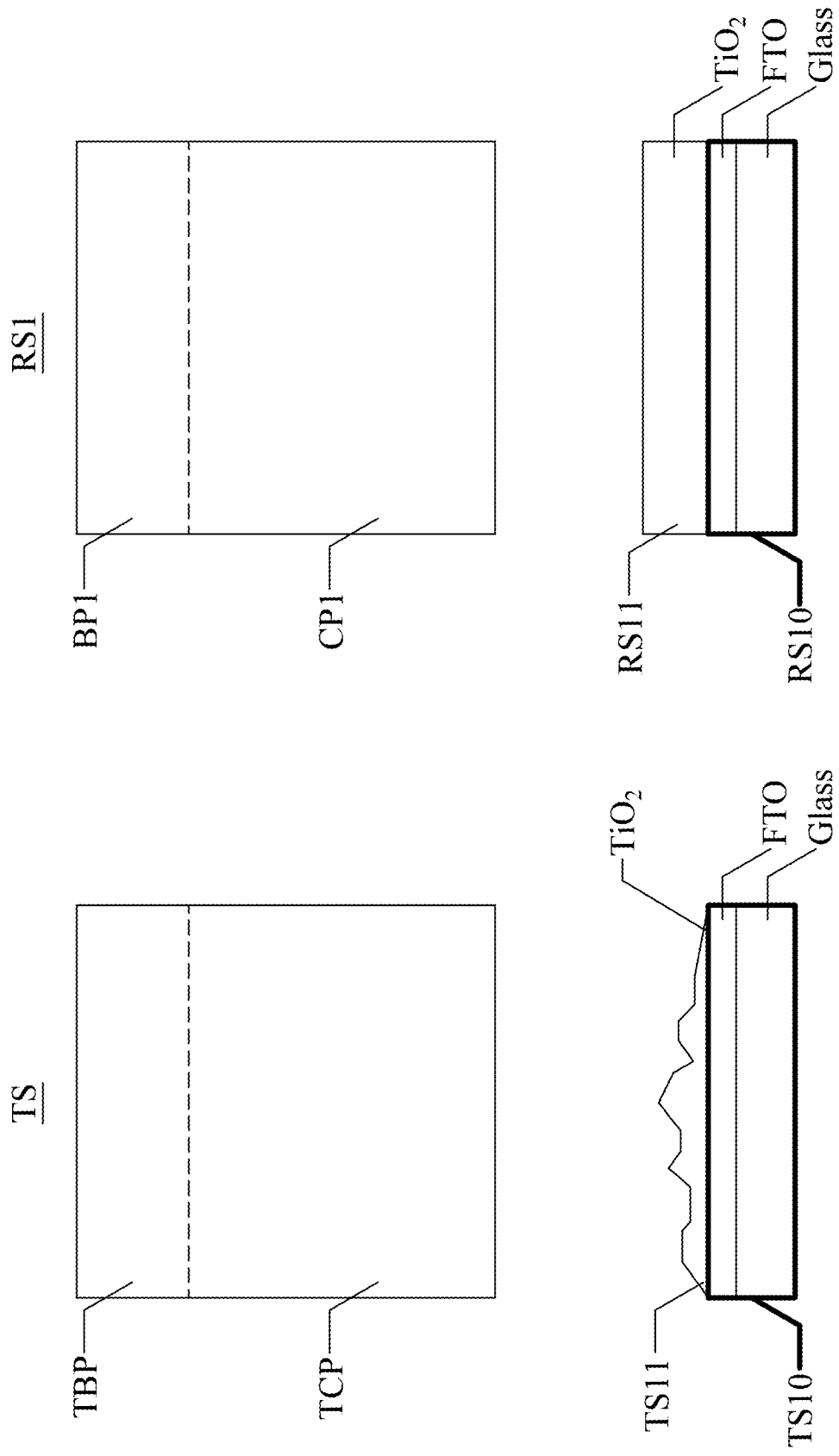
FIG. 4A shows top and side views of a test sample according to the first embodiment of the present disclosure.
FIG. 4B shows top and side views of one of the plurality of first reference samples according to the first embodiment of the present disclosure.

FIG. 4A shows the top and side views of a test sample according to the first embodiment. As shown, the test sample TS includes a test substrate TS10 and a first test layer TS11. The test substrate TS10 includes a test covered portion TCP and a test bare portion TBP, the first test layer TS11 is disposed on the test substrate TS10 in the test covered portion TCP, and the first test layer TS11 is made of a first material of interest. It is noted that in this embodiment the first test layer TS11 does not cover the whole surface, but only the test covered portion TCP of the test substrate TS10. Furthermore, the test covered portion TCP and the test bare portion TBP of the test sample TS may be physically separated and individually prepared.

Step S101: preparing a plurality of first reference samples RS1. FIG. 4B shows the top and side views of one of the plurality of first reference samples according to the first embodiment. Each of the first reference samples RS1 includes a first reference substrate RS10 and a first layer RS11. Similarly, for each of the first reference samples RS1, the first layer RS11 does not cover the whole surface, but only a portion of the surface of the reference substrate RS10. The first reference substrate RS10 includes a first covered portion CP1 and a first bare portion BP1, the first layer RS11 is disposed on the first reference substrate RS10 in the first covered portion CP1, and the first layer RS11 is made of the first material of interest.

For example, the first reference samples RS1 are prepared to have the same thickness of glass, FTO layers, but different thicknesses of the first material of interest (e.g., TiO2). In the present example, three reference samples with known thicknesses are used. Particularly, the thicknesses of $TiO_2$ layer are 10 nm for first one of the first reference samples RS1, 65.1 nm for the second one of the first reference samples RS1, and 313.5 nm for the third one of the first reference samples RS1. These three reference samples with known thicknesses must be uniform as the precision of this step will define the precision of the following measurements. For example, small size samples or samples deposited using high-precision methods (e.g., magnetron sputtering) may be used to prepare these three reference samples.

During the preparations, a part of each of the first reference samples RS1 is protected from deposition so the first bare portion BP1 having a bare first reference substrate RS10 (e.g., FTO/glass without $TiO_2$) may be obtained. For example, a scotch tape may be attached to the first reference sample RS1 before $TiO_2$ layer is deposited, and the scotch tape is removed after the deposition. Alternatively, a mask may be used to prevent the first bare portion BP1 from deposition of $TiO_2$.

Step S102: choosing a first region of wavelength corresponding to an absorption edge of the first material of interest.

In detail, the first region of wavelength is chosen in a predetermined region less than a minimum wavelength in a transmittance spectrum corresponding to the absorption edge of the first material of interest. The first material of interest may be, for example, $TiO_2$, and the first region of wavelength can be chosen in a region that is about 10 to 20 nm less than the minimum transmittance in the transmittance spectrum corresponding to the absorption edge that can be calculated as $\lambda=1,240/Eg$, where $\lambda$ is wavelength and Eg is a band gap width in eV. Therefore, a region from 330 to 340 nm can be chosen as the first region of wavelength for $TiO_2$.

Step S103: performing a first calibration process for each of the first reference samples RS1 to obtain a plurality of first quality values Q1 and a plurality of first thicknesses t1 corresponding to the plurality of first quality values Q1.

Figure 5:
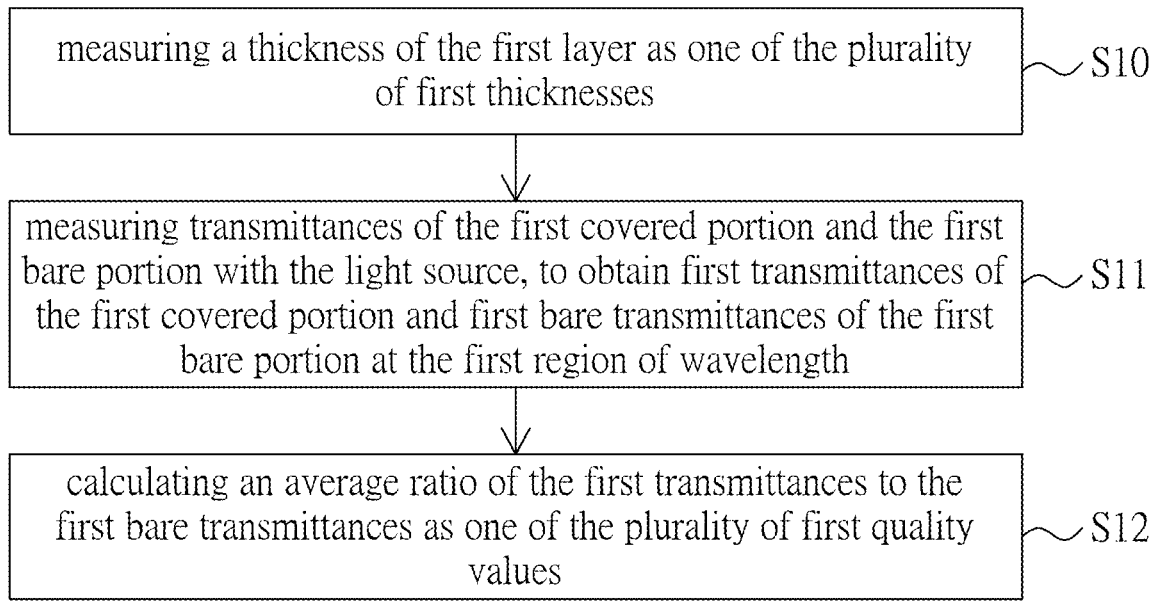
FIG. 5 is a flowchart of the first calibration process according to the first embodiment.

FIG. 5 is a flowchart of the first calibration process of Step S103 according to the first embodiment of the present disclosure. The first calibration process includes the following steps:

Step S10: measuring a thickness of the first layer RS11 as one of the plurality of first thicknesses t1. In detail, the thickness can be measured by using ellipsometry or profilometry techniques. For example, the thicknesses of $TiO_2$ layer are measured to be 10, 65.1 and 313.5 nm for the first, second and third one of the first reference samples RS1, as mentioned above.

Step S11: measuring transmittances of the first covered portion CP1 and the first bare portion BP1 with the light source 10, to obtain first transmittances of the first covered portion CP1 and first bare transmittances of the first bare portion BP1 at the first region of wavelength.

For example, the region from 330 to 340 nm as the first region of wavelength for $TiO_2$ chosen in the previous step can be utilized for measuring transmittances of the first covered portion CP1 and the first bare portion BP1.

In the present step, the computing device 18 is configured to control the light source 10 to be turned on, and control the detector 16 to track transmittance in the wavelength region of 330 to 340 nm (for $TiO_2$) passing through the plurality of first reference samples RS1. Afterward, the computing device 18 is further configured to obtain the transmittances and calculates first quality values Q1 hereinafter.

It should be noted that experimental features like temperature of the light source, humidity during measurements, and the like are preferred to be considered. The first bare transmittance of the first bare portion BP1 is taken as an absolute reference, but the present disclosure is not limited thereto, and the transmittances in % of the first bare portion may be taken as 100%. Step S12: calculating an average ratio of the first transmittances to the first bare transmittances as one of the plurality of first quality values Q1. That is, the first quality value may be represented by the following equation:

$$Q1=\text{Avg}(T\% \text{ of the first covered portion}/T\% \text{ of the first bare portion}) \quad \text{Equation (1)}.$$

Figure 6:
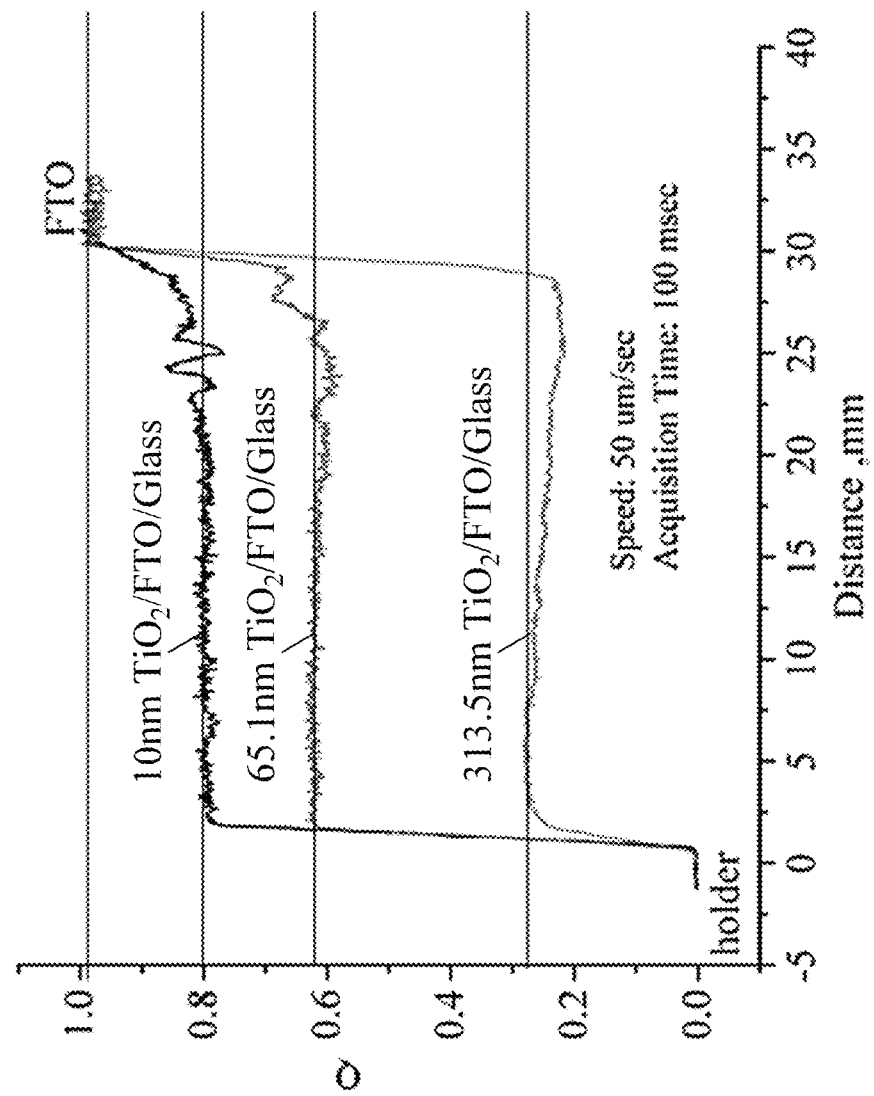
FIG. 6 is a plot diagram showing quality values versus distances along a path across a first covered portion and a first bare portion.

FIG. 6 is a plot diagram showing quality values Q versus distances along a path across the first covered portion CP1 and the first bare portion BP1. As shown in FIG. 6, samples with different thicknesses of $TiO_2$ layer would have different T % profiles.

Refer back to FIG. 3. The inspection method further proceeds to Step S104: applying a linear approximation to obtain a first calibration function Q1(t1) according to the plurality of first quality values Q1 and the plurality of first thicknesses t1.

For example, a linear approximation (e.g., Y=Slope*X obtained by using an iterative procedure for linear curve fitting) may be used to obtain a calibration curve Q1=f (first thickness t1) according to the first thicknesses t1 and the first quality values Q1 corresponding to the different first thicknesses t1.

Figure 7:
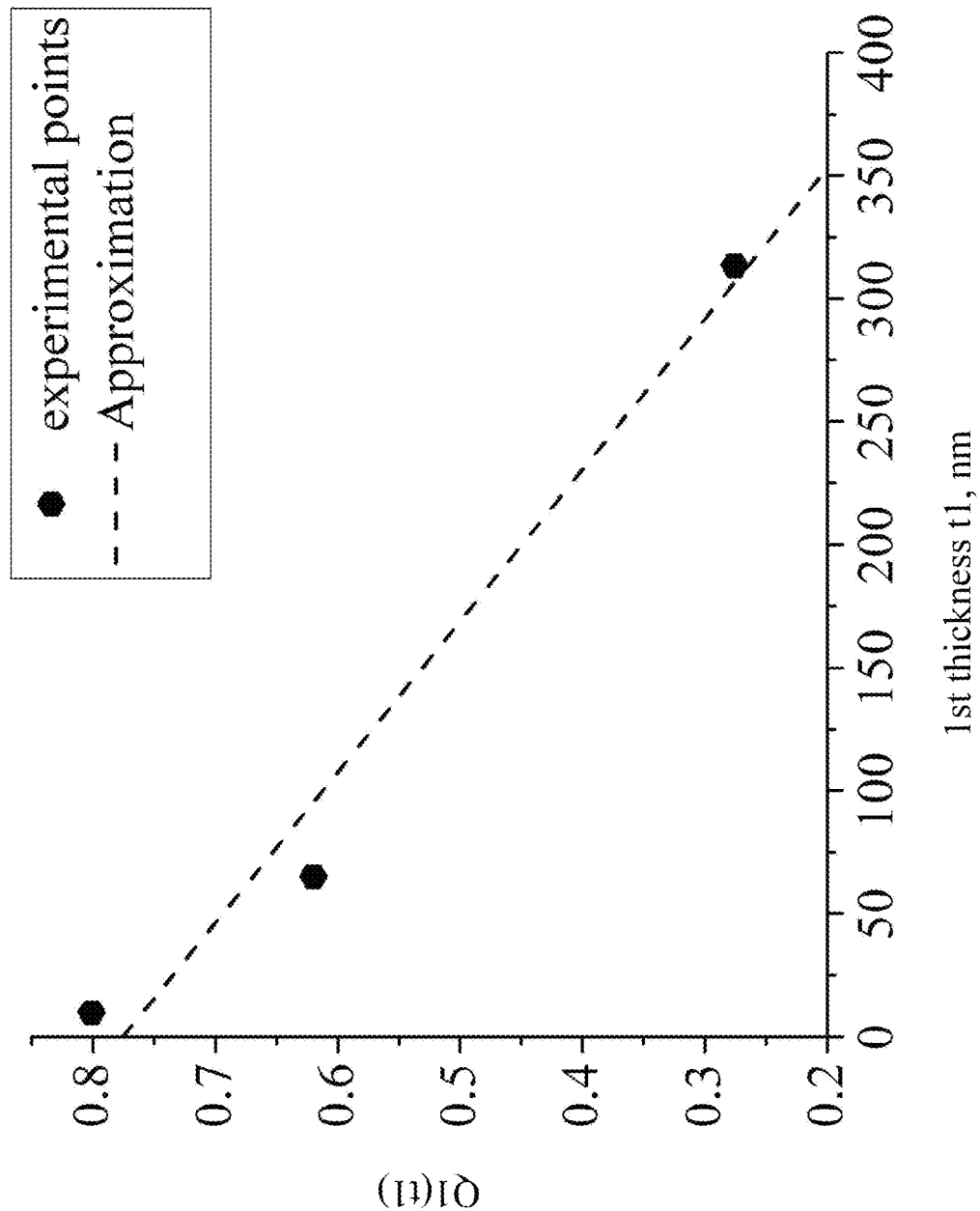
FIG. 7 is a plot diagram showing a first calibration function and three experimental points with different first thicknesses.

FIG. 7 is a plot diagram showing the first calibration curve Q1(t1) and three experimental points with different first thicknesses t1. In this embodiment three experimental points are used for obtaining the first calibration curve. It is noted that with more experimental points, a better first calibration curve with higher precision could be obtained.

Refer back to FIG. 3. The inspection method further proceeds to Step S105: measuring a transmittance of the test bare portion TBP of the test sample TS, to obtain a test bare transmittance of the test bare portion TBP at the first region of wavelength. Similarly, in the present step, the computing device 18 is configured to control the light source 10 to be turned on, and control the detector 16 to track transmittance in the wavelength region of 330 to 340 nm (for $TiO_2$) passing through the test bare portion TBP of the test sample TS. Afterward, the computing device 18 is further configured to obtain the transmittances and calculates test quality values Qt1 hereinafter.

Figure 8:
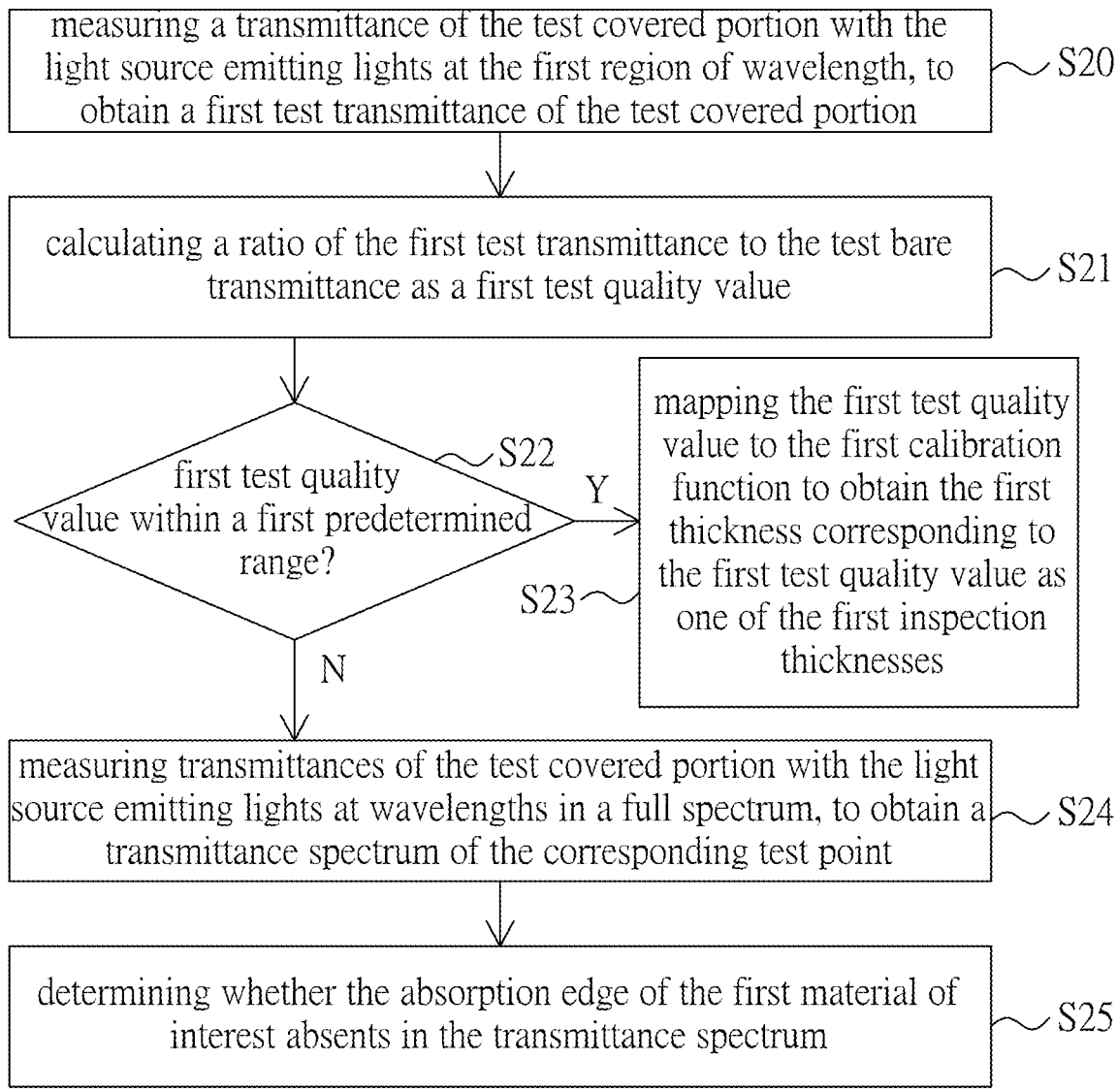
FIG. 8 is a flowchart of the inspection process according to the first embodiment of the present disclosure.

Step S106: performing an inspection process for each of a plurality of test points in the test covered portion TCP of the test sample TS to obtain a plurality of first inspection thicknesses ti1. FIG. 8 shows a flowchart of the inspection process according to the first embodiment, and includes the following steps:

Step S20: measuring a transmittance of the test covered portion TCP with the light source emitting lights at the first region of wavelength, to obtain a first test transmittance of the test covered portion TCP.

Step S21: calculating a ratio of the first test transmittance to the test bare transmittance as a first test quality value Qt1. That is, the first test quality value Qt1 can be represented by the following equation:

$$Qt1 = T\% \text{ of the test covered portion} / T\% \text{ of the test bare portion} \quad \text{Equation (2).}$$

Step S22: determining whether the first test quality value Qt1 within a first predetermined range. Specifically, the first predetermined range can be determined according to an average of the plurality of the first test quality value Qt1. For example, the first predetermined range may be set from 50% to 150% of the average of the first test quality values Qt1. That is to say, if the first test quality value Qt1 is smaller than 50% of the average of the first test quality values Qt1, there may be a dust or parasitic phase at the test point, if the first test quality value Qt1 is larger than 150% of the average of the first test quality values Qt1, there may be a pinhole at the test point.

In response to the first test quality value Qt1 being determined within the first predetermined range, the inspection process proceeds to step S23: mapping the first test quality value Qt1 to the first calibration function Q1(t1) to obtain the first thickness t1 corresponding to the first test quality value Qt1 as one of the first inspection thicknesses ti1.

In response to the first test quality value Qt1 being determined not within the first predetermined range, the inspection process proceeds to step S24: measuring transmittances of the test covered portion TCP with the light source emitting lights at wavelengths in a full spectrum, to obtain a transmittance spectrum of the corresponding test point.

In this case, the full spectrum is recorded by changing from detecting only the first region of wavelength (e.g., 330-340 nm) to detecting the full spectrum of wavelength at the corresponding test point for performing further analysis.

For example, the inspection process may further proceed to step S25: determining whether the absorption edge of the first material of interest absents in the transmittance spectrum, thereby checking whether there is a dust/parasitic phase/pinhole at the corresponding test point.

After the plurality of first inspection thicknesses ti1 are obtained, the inspection method proceeds step S107: using the computing device 18 to obtain a stratigraphic thickness (ST) maps of each layer in the semiconductor device.

Figure 9:
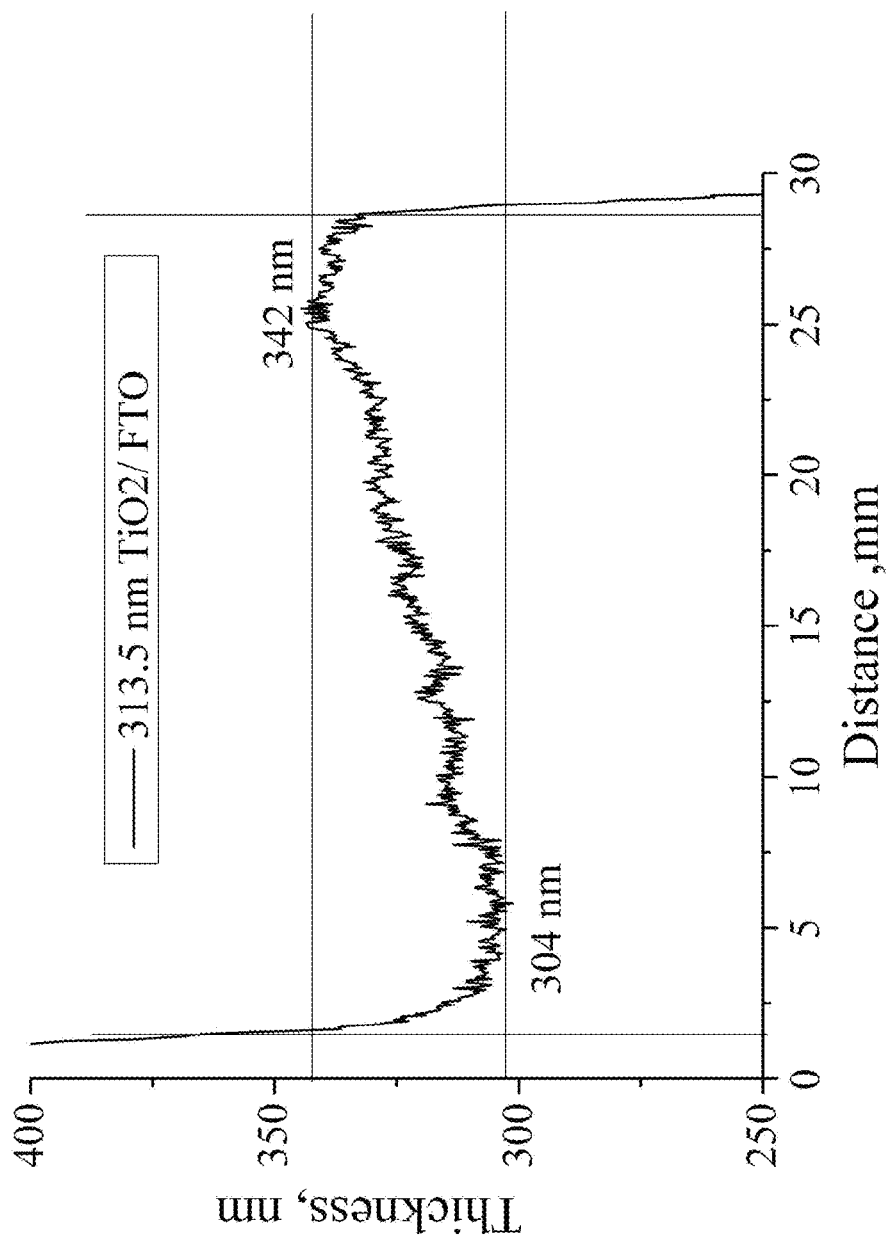
FIG. 9 is a plot diagram showing first inspection thicknesses ti1 of a test sample obtained by one direction scan on a test sample having $TiO_2$/FTO/Glass.

FIG. 9 is a plot diagram showing first inspection thicknesses ti1 of a test sample obtained by one direction scan on a test sample having $TiO_2$/FTO/Glass. As shown, although parameters for manufacturing the test sample using 313.5 nm for $TiO_2$ layer, however, the absolute thickness of the $TiO_2$ layer varies from 304 nm to 342 nm, and uniformity can also be analyzed according to FIG. 9.

In the first embodiment, the test substrate TS10 includes a test bare portion TBP. It is noted that the test bare portion TBP is not necessary; a test sample without any layers of interest and containing just substrate may also be used to achieve the same function.

Similarly, in this embodiment, the first reference sample RS1 includes a first bare portion BP1. It is noted that the first bare portion BP1 is not necessary, and a reference sample without any layers of interest and containing substrate merely may also be used to achieve the same function.

Second Embodiment

Figure 10A:
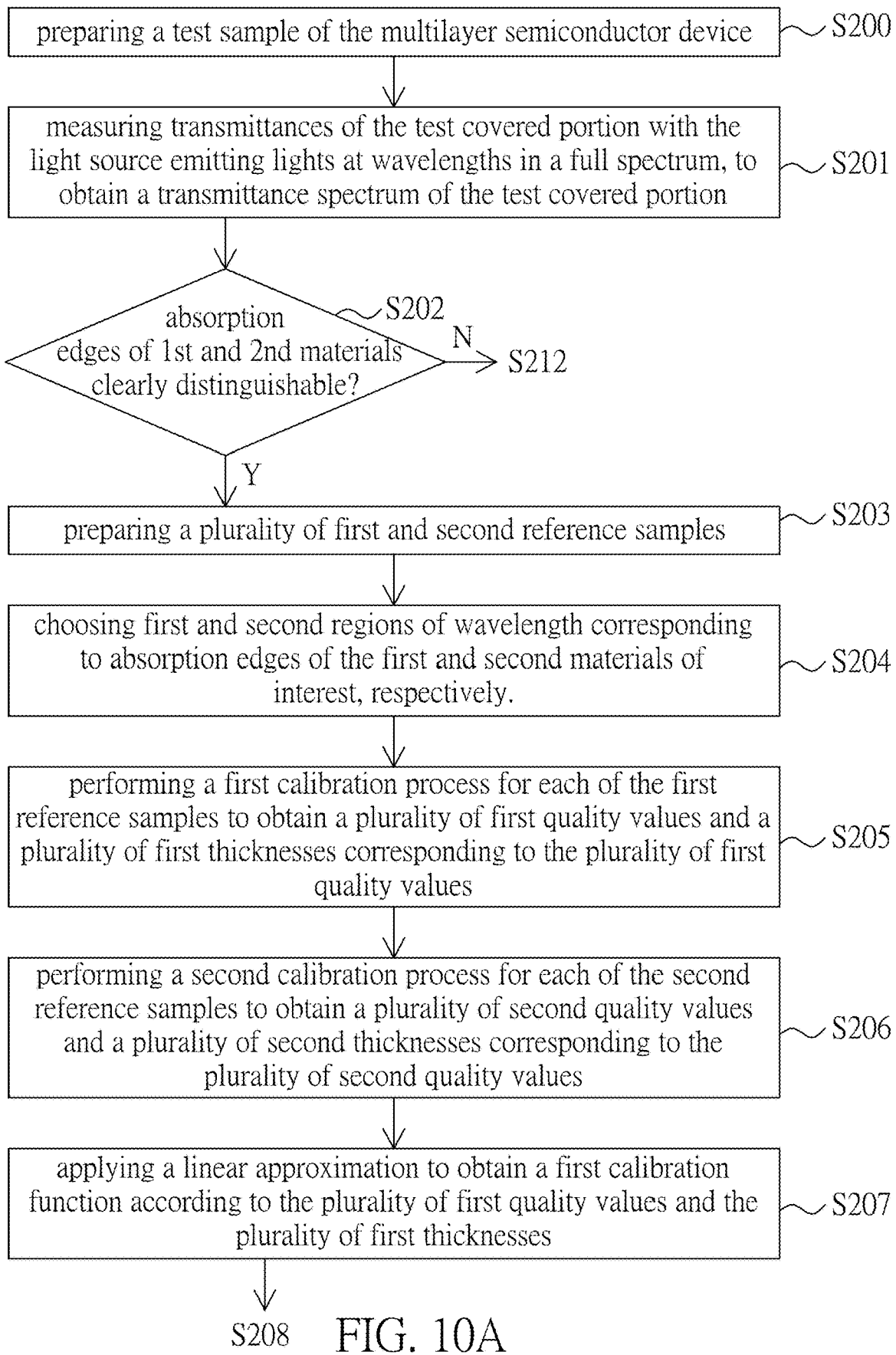
FIGS. 10A and 10B are flowcharts showing an inspection method for a multilayer semiconductor device according to a second embodiment.
Figure 10B:
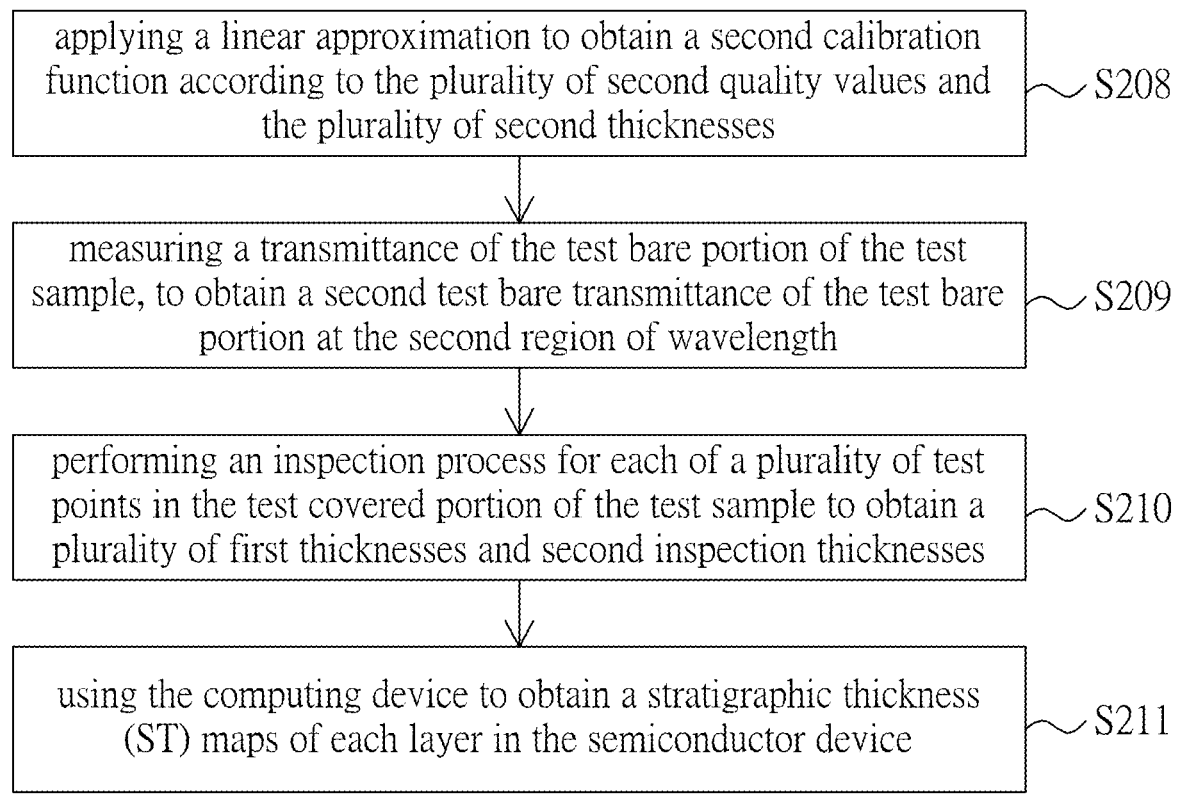

FIG. 10A and FIG. 10B are flowcharts showing an inspection method for a multilayer semiconductor device according to a second embodiment of the present disclosure.

The second embodiment provides an inspection method applicable to the inspection system provided in the previous embodiment, and includes the following steps:

Step S200: preparing a test sample TS of the multilayer semiconductor device. It should be noted that the inspection method of the second embodiment may be specifically applied on a multilayer semiconductor device including a structure with two layers in addition to a conductive glass substrate having a glass layer and a transparent conductor layer, but the present disclosure is not limited thereto.

FIG. 11A shows top and side views of the test sample according to the second embodiment. The test sample TS includes a test substrate TS10, a first test layer TS11 and a second test layer TS12. The test substrate TS10 includes a test covered portion TCP and a test bare portion TBP, the first test layer TS11 is disposed on the test substrate TS10 in the test covered portion TCP, and the first test layer TS11 is made of a first material of interest. The second test layer TS12 is disposed on the first test layer TS11 in the test covered portion TCP, and the second test layer TS12 is made of a second material of interest different from the first material of interest.

Step S201: measuring transmittances of the test covered portion TCP with the light source 10 emitting lights at wavelengths in a full spectrum, to obtain a transmittance spectrum of the test covered portion TCP.

Step S202: determining whether absorption edges of the first material of interest and the second material of interest are clearly distinguishable. In the cases with clearly distinguishable absorption edges of the first and the second materials, undoped materials (i.e., without impurities) may be used in the test sample. In the cases with not-clearly-distinguishable (i.e., merged) absorption edges of the first and the second materials, doped materials (i.e., with impurities) may be used in the test sample. These doped materials will have additional absorbance below the absorption edge due to the free carrier absorption due to ionized impurities.

In response to absorption edges of the first material of interest and the second material of interest being determined to be clearly distinguishable, the inspection method proceeds to step S203: preparing a plurality of first reference samples and a plurality of second reference samples. The first reference samples are prepared the same as the first reference samples RS1 in the first embodiment, and therefore detailed descriptions are omitted.

FIG. 11B shows the top and side views of one of the plurality of second reference samples according to the second embodiment. Each of the plurality of second reference samples RS2 includes a second reference substrate RS20, a first sublayer RS21 and a second sublayer RS22. The second reference substrate RS20 has a second covered portion CP2 and a second bare portion BP2.

The first sublayer RS21 is disposed on the second reference substrate RS20 in the second covered portion CP2, and the first sublayer RS21 is made of the first material of interest, and all the first sublayers of the plurality of the second reference samples have the same thicknesses.

The second sublayer RS22 is disposed on the first sublayer RS21 in the second covered portion CP2, the second sublayer RS22 is made of the second material of interest, and each of the second sublayers RS22 of the plurality of second reference samples RS2 has a different thickness, respectively. For example, the second material of interest may be MAPbI$_3$ perovskite, and the thicknesses of MAPbI$_3$ perovskite layer are 100, 300 and 600 nm for first, second and third one of the second reference samples RS2.

During the preparations, a part of each of the second reference samples RS2 is protected from deposition to get the second bare portion BP2 having a bare first reference substrate RS20 (e.g., FTO/glass without TiO$_2$). For example, a scotch tape may be attached onto the second reference sample RS2 before the TiO$_2$ and MAPbI$_3$ perovskite layers are deposited, and the scotch tape is removed after the deposition. Alternatively, a mask may be used to prevent the second bare portion BP2 from deposition of TiO$_2$ and MAPbI$_3$ perovskite.

Step S204: choosing a first and second regions of wavelength corresponding to absorption edges of the first and second materials of interest, respectively.

The first material of interest may be, for example, TiO$_2$, and the second material of interest may be, for example, MAPbI$_3$ perovskite. In such case, as disclosed above, a region from 330 to 340 nm may be chosen as the first region of wavelength for the first material of interest (i.e., TiO$_2$); a region from 750 to 760 nm may be chosen as the second region of wavelength for the second material of interest (i.e., MAPbI$_3$ perovskite).

Step S205: performing a first calibration process for each of the first reference samples RS1 to obtain a plurality of first quality values Q1 and a plurality of first thicknesses t1 corresponding to the plurality of first quality values Q1. Since the first calibration process has been described in the first embodiment, the repeated descriptions are omitted.

Step S206: performing a second calibration process for each of the second reference samples RS2 to obtain a plurality of second quality values Q2 and a plurality of second thicknesses t2 corresponding to the plurality of second quality values Q2.

Figure 12:
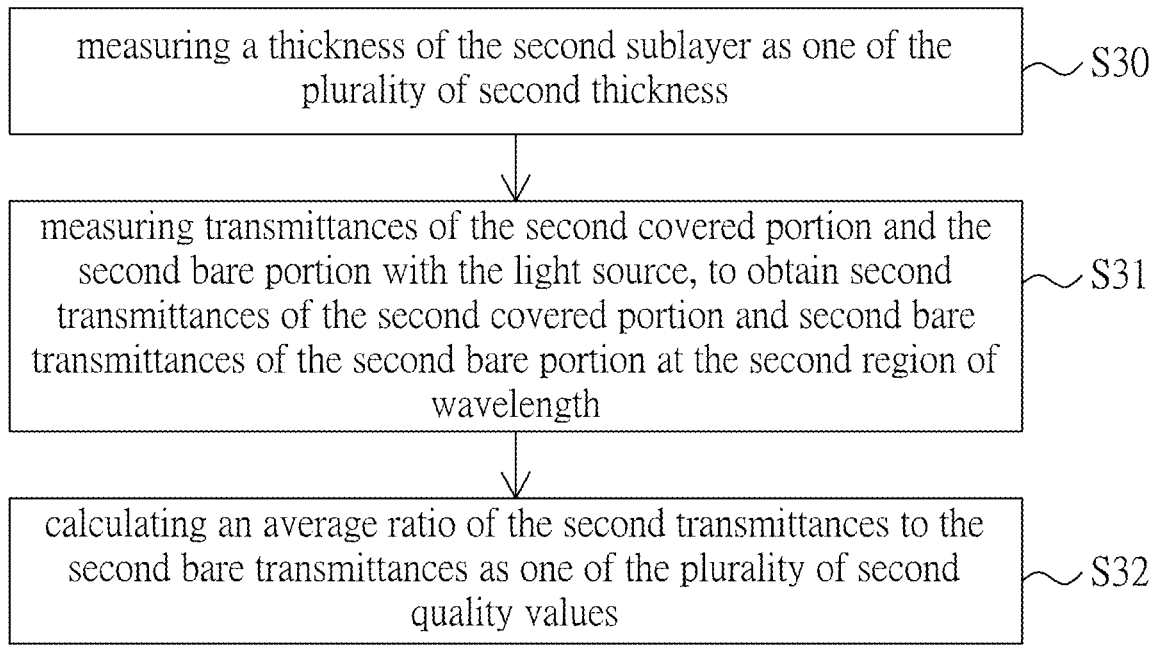
FIG. 12 is a flowchart of the second calibration process according to the second embodiment.

FIG. 12 is a flowchart of the second calibration process according to the second embodiment of the present disclosure. As shown, the second calibration process includes the following steps:

Step S30: measuring a thickness of the second sublayer RS22 as one of the plurality of second thickness t2. In detail, the thickness can be measured by using ellipsometry or profilometry measurement. For example, the thicknesses of MAPbI$_3$ perovskite layer are measured to be 100, 300 and 600 nm for first, second and third one of the second reference samples RS2.

Step S31: measuring transmittances of the second covered portion CP2 and the second bare portion BP2 with the light source 10, to obtain second transmittances of the second covered portion CP2 and second bare transmittances of the second bare portion BP2 at the second region of wavelength.

Step S32: calculating an average ratio of the second transmittances to the second bare transmittances as one of the plurality of second quality values Q2. That is, the second quality value may be represented by the following equation:

$$Q2 = \text{Avg}(T\% \text{ of the second covered portion}/T\% \text{ of the second bare portion}) \quad \text{Equation (3)}.$$

Figure 13:
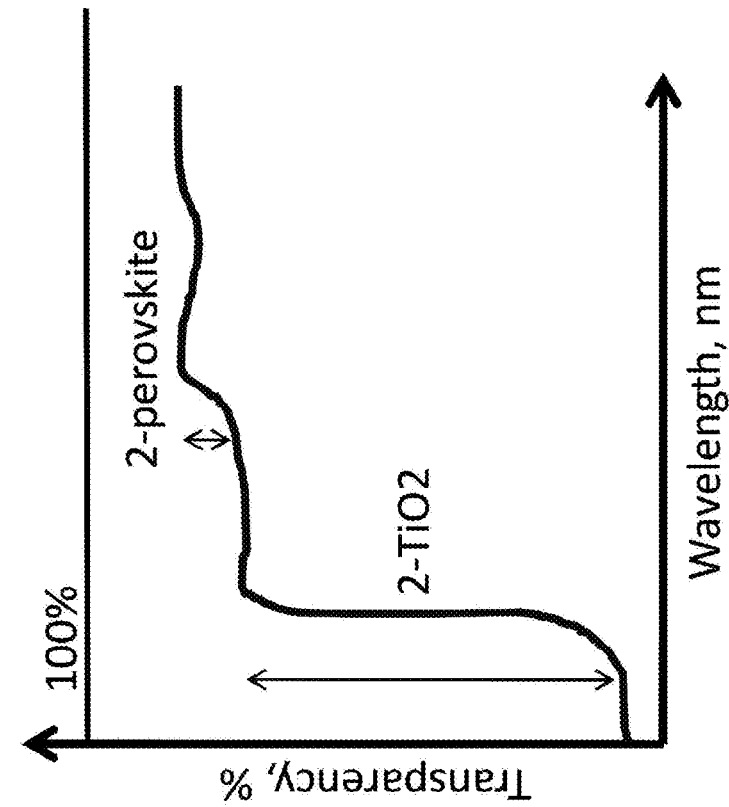
FIG. 13 is a plot diagram showing absorption edges of the first material of interest and the second material of interest being determined to be clearly distinguishable and not to be clearly distinguishable.
Figure 13:
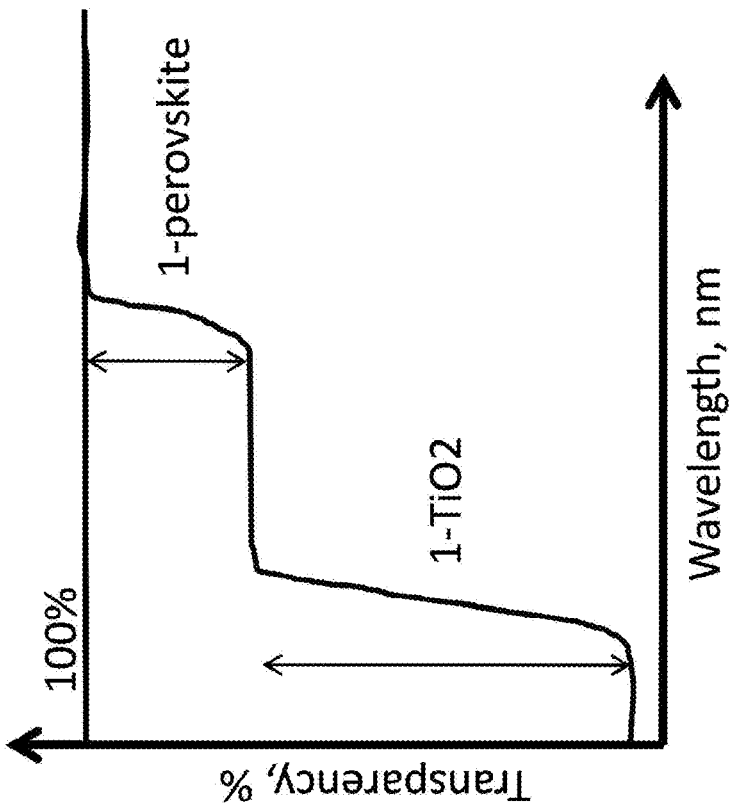

FIG. 13 is a plot diagram showing absorption edges of the first material of interest and the second material of interest being determined to be clearly distinguishable and not to be clearly distinguishable.

Figure 14B:
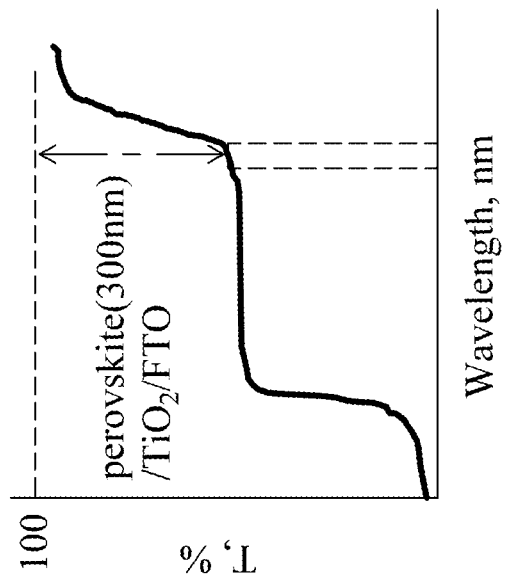
FIGS. 14A-14C are plot diagrams showing first and second transmittances in a region of wavelength covering the first and second regions of wavelength.
Figure 14A:
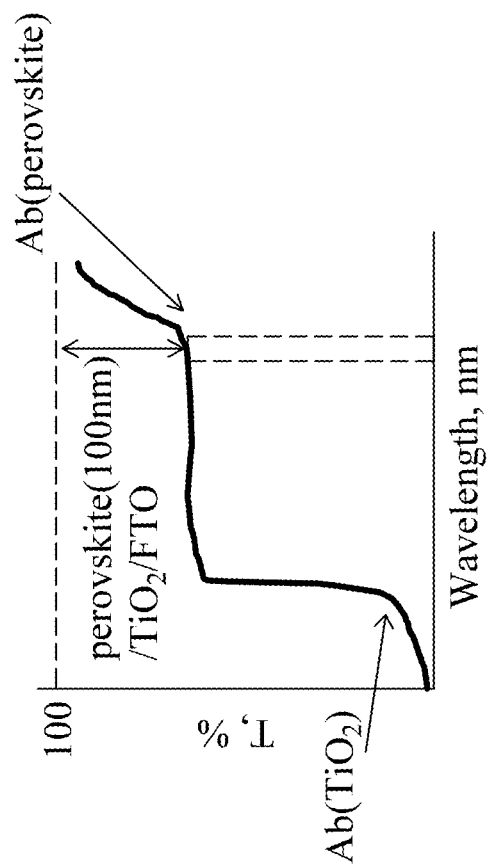
Figure 14C:
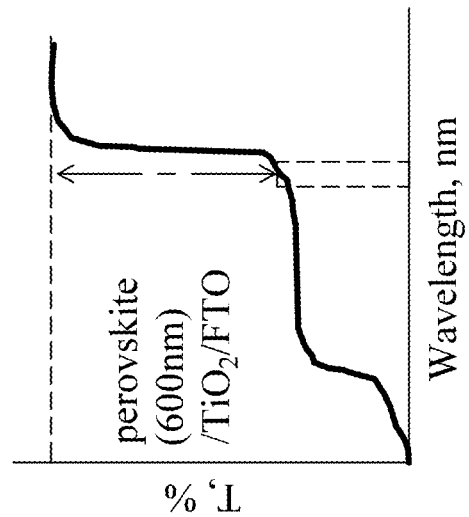

FIGS. 14A to 14C are plot diagrams showing first and second transmittances in a region of wavelength covering the first and second regions of wavelength. As shown in FIG. 14A to 14C, samples with different thicknesses of MAPbI$_3$ perovskite layer will have different T % profiles.

The inspection method further proceeds to Step S207: applying a linear approximation to obtain a first calibration function Q1(t1) according to the plurality of first quality values Q1 and the plurality of first thicknesses t1.

Step S208: applying a linear approximation to obtain a second calibration function Q2(t2) according to the plurality of second quality values Q2 and the plurality of second thicknesses t2.

Similarly, a linear approximation (e.g., Y=Slope*X obtained by using an iterative procedure for linear curve fitting) may be used to obtain a calibration curve Q2=f (second thickness t2) according to the second thicknesses t2 and the second quality values Q2 corresponding to the different second thicknesses t2.

Figure 15:
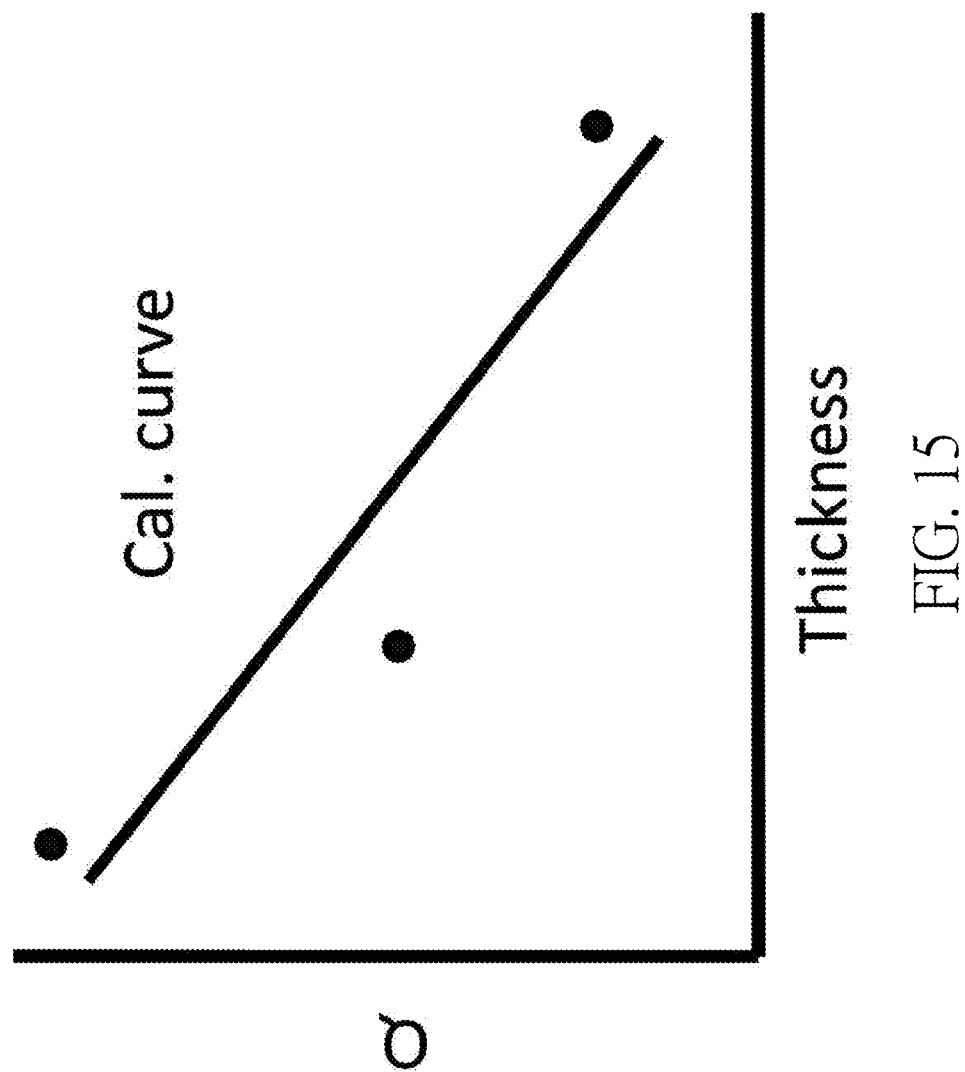
FIG. 15 is a plot diagram showing the second calibration function and three experimental points with different first thicknesses.

FIG. 15 is a plot diagram showing the second calibration function Q2(t2) and three experimental points with different first thicknesses t2.

Step S209: measuring a transmittance of the test bare portion TBP of the test sample TS, to obtain a second test bare transmittance of the test bare portion TBP at the second region of wavelength. Similarly, in the present step, the computing device 18 is configured to control the light source 10 to be turned on, and control the detector 16 to track transmittance in the wavelength region of 750 to 760 nm (for $MAPbI_3$ perovskite) passing through the test bare portion TBP of the test sample TS. Afterward, the computing device 18 is further configured to obtain the transmittances and calculates second test quality values Qt2 hereinafter.

Figure 16:
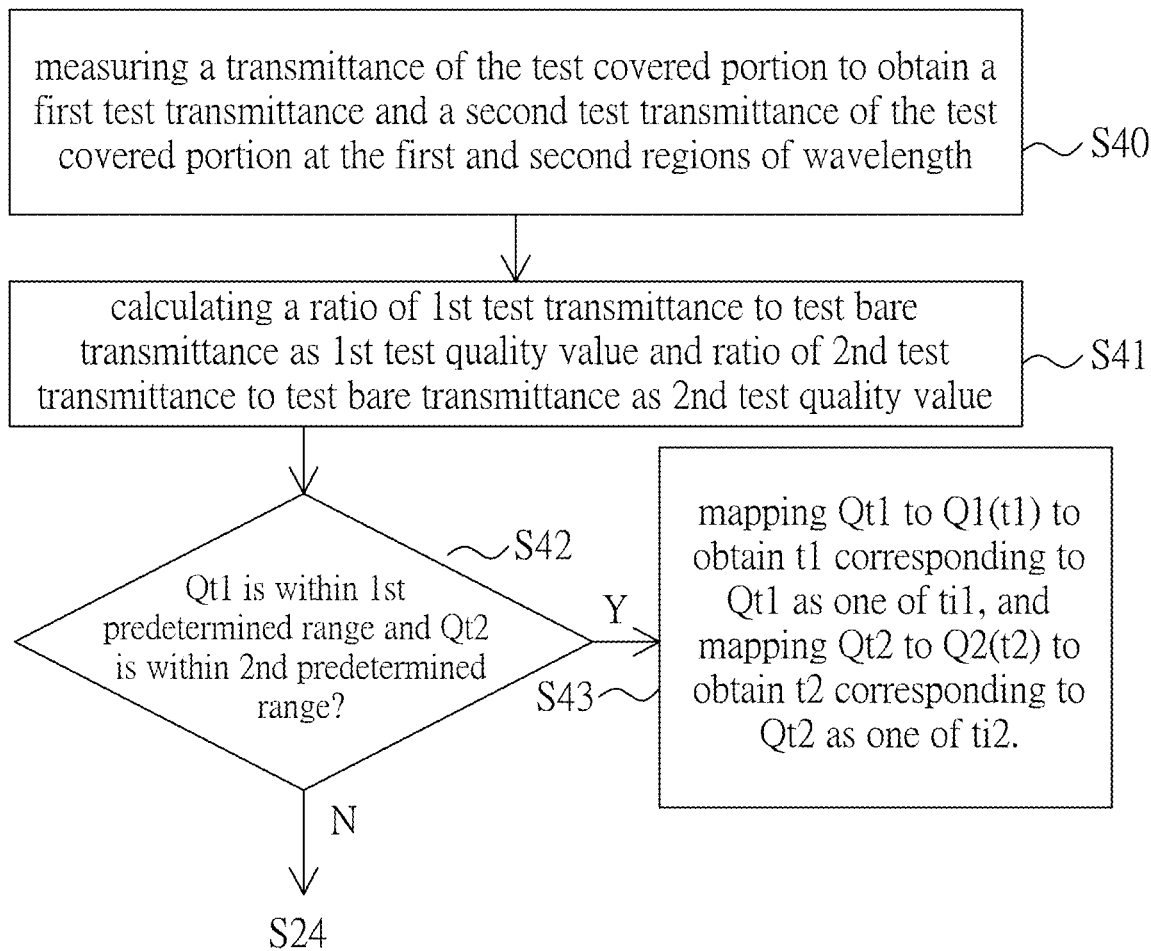
FIG. 16 is a flowchart of the inspection process according to the second embodiment.

Step S210: performing an inspection process for each of a plurality of test points in the test covered portion TCP of the test sample TS to obtain a plurality of first thicknesses ti1 and second inspection thicknesses ti2. FIG. 16 is a flowchart of the inspection process according to the second embodiment, and the inspection process includes the following steps:

Step S40: measuring a transmittance of the test covered portion TCP to obtain a first test transmittance and a second test transmittance of the test covered portion TCP at the first and second regions of wavelength.

Step S41: calculating a ratio of the first test transmittance to the test bare transmittance as a first test quality value Qt1, and a ratio of the second test transmittance to the test bare transmittance as a second test quality value Qt2. That is, the second test quality value Qt2 can be represented by the following equation:

$$Qt2 = \text{2nd } T\% \text{ of the test covered portion} / \text{2nd } T\% \text{ of the test bare portion} \quad \text{Equation (4).}$$

Step S42: determining whether the first test quality value Qt1 is within a first predetermined range, and whether the second test quality value Qt2 is within a second predetermined range. Specifically, the first predetermined range may be determined according to an average of the plurality of first test quality value Qt1, and the second predetermined range may be determined according to an average of the plurality of second test quality value Qt2. For example, the second predetermined range may be set from 50% to 150% of the average of the second test quality values Qt2. If the second test quality value Qt2 is smaller than 50% of the average of the second test quality values Qt2, there may be a dust or parasitic phase at the test point; if the second test quality value Qt2 is larger than 150% of the average of the second test quality values Qt2, there may be a pinhole at the test point.

In response to the first test quality value Qt1 and the second test value Qt2 being determined within the first predetermined range and the second predetermined range, respectively, the inspection process proceeds to step S43: mapping the first test quality value Qt1 to the first calibration function Q1(t1) to obtain the first thickness t1 corresponding to the first test quality value Qt1 as one of the first inspection thicknesses ti1, and mapping the second test quality value Qt2 to the second calibration function Q2(t2) to obtain the second thickness t2 corresponding to the second test quality value Qt2 as one of the second inspection thicknesses ti2.

If the first test quality value Qt1 is determined not to be within the first predetermined range, the inspection process proceeds to step S24 mentioned in the first embodiment, and the repeated descriptions are omitted.

After the plurality of first inspection thicknesses ti1 and second inspection thicknesses ti2 are obtained, the inspection method proceeds step S211: using the computing device 18 to obtain a stratigraphic thickness (ST) maps of each layer in the semiconductor device.

Figure 17:
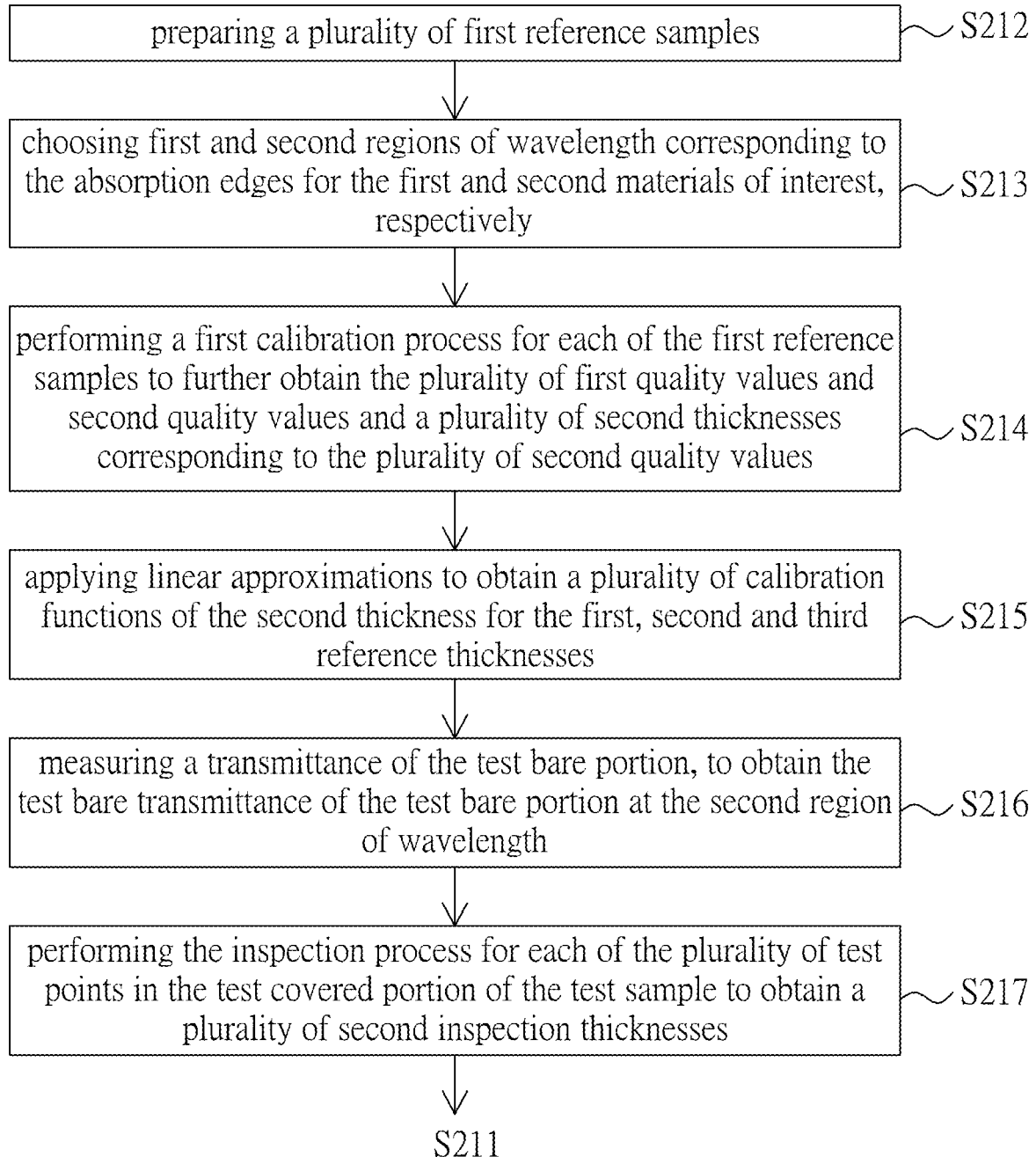
FIG. 17 is another flowchart of the inspection method according to the second embodiment.

FIG. 17 is another flowchart of the inspection method according to the second embodiment in the case where the absorption edges of the first material of interest and the second material of interest are not clearly distinguishable.

Step S212: preparing a plurality of first reference samples. The first reference samples are prepared in the same way as the first reference samples RS1 in the first embodiment, except that each of the first reference samples RS1 further includes a second layer RS12 disposed on the first layer RS11 in the first covered portion CP1, and the second layer RS12 is made of the second material of interest different from the first material of interest. The second material of interest may be, for example, $MAPbI_3$ perovskite.

Figure 18:
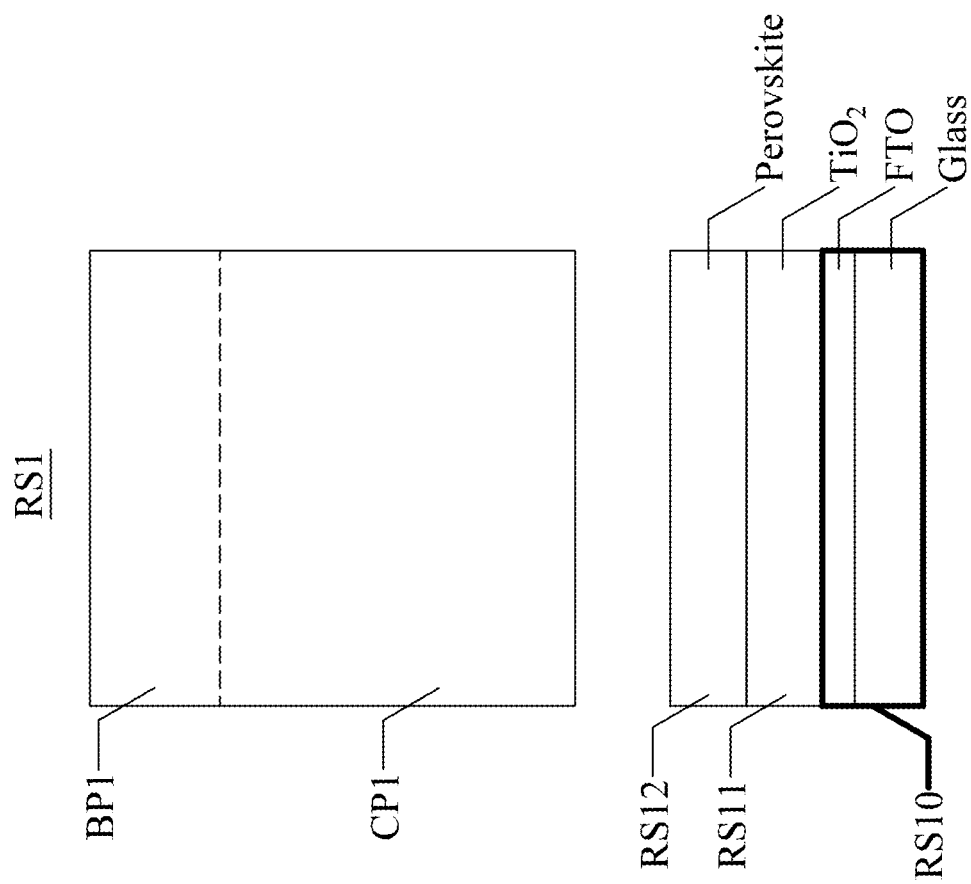
FIG. 18 shows top and side views of one of the plurality of first reference samples.

FIG. 18 shows the top and side views of one of the plurality of first reference samples. The plurality of first reference samples RS1 at least includes three sets of reference samples. For example, a first set of reference samples including the first layers RS11 each having a first reference thickness, a second set of reference samples including the first layers RS11 each having a second reference thickness, and a third set of reference samples including the first layers RS11 each having a third reference thickness.

In other words, multiple reference samples, for example, nine reference samples are manufactured, including the 1st, 2nd, 3rd, 4th, 5th, 6th, 7th, 8th, and 9th reference samples. All nine reference samples have the same thicknesses of glass and FTO layers, but different thickness of the first layer RS11 (e.g., $TiO_2$). Thus, the 1st, 2nd, and 3rd reference samples have same 1st thickness (e.g., 100 nm) of the first layer RS11. The 4th, 5th, and 6th reference samples have same 2nd thickness (e.g., 300 nm) of the first layer RS11. The 7th, 8th, and 9th reference samples have same 3rd thickness (e.g., 900 nm) of the first layer RS11.

Furthermore, a second layer RS12 made of the second material of interest is formed on the first layer RS11 of each of the first reference samples. Therefore, each of the first set, the second set and the third set of reference samples includes the second layers having a fourth reference thickness, a fifth reference thickness and a sixth reference thickness, respectively.

In this way, the second layer RS12 (e.g., Perovskite) of different thicknesses are deposited on the nine reference samples, including: 1) 100 nm $TiO_2$/100 nm perovskite, 2) 100 nm $TiO_2$/300 nm perovskite, 3) 100 nm $TiO_2$/600 nm perovskite, 4) 300 nm $TiO_2$/100 nm perovskite, 5) 300 nm $TiO_2$/300 nm perovskite, 6) 300 nm $TiO_2$/600 nm perovskite, 7) 600 nm $TiO_2$/100 nm perovskite, 8) 600 nm $TiO_2$/300 nm perovskite, 9) 600 nm $TiO_2$/600 nm perovskite).

Step S213: choosing first and second regions of wavelength corresponding to the absorption edges for the first and second materials of interest, respectively.

Figure 19:
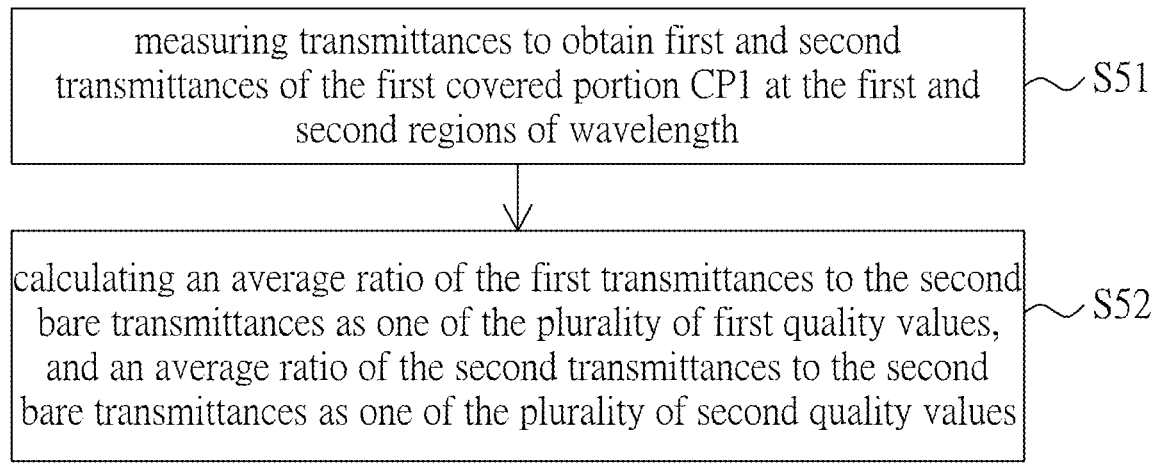
FIG. 19 is a flowchart of the first calibration process according to the second embodiment.

Step S214: performing a first calibration process for each of the first reference samples to further obtain the plurality of first quality values Q1 and second quality values Q2 and a plurality of second thicknesses t2 corresponding to the plurality of second quality values. FIG. 19 is a flowchart of the first calibration process according to the second embodiment. The first calibration process includes:

Step S51: measuring transmittances to obtain first and second transmittances of the first covered portion CP1 at the first and second regions of wavelength.

In the present step, each of the first transmittances is a difference between the transmittance measured in a first predetermined region less than a wavelength corresponding to a minimum transmittance of the absorption edge of the first material of interest and the transmittance measured in a second predetermined region larger than a maximum wavelength corresponding to the absorption edge of the first material of interest.

For example, the difference L is the transmittance of the first layer RS11 that is the distance between the transmittance in the region that is about 5 to 10 nm lesser than a wavelength with the minimum transmittance corresponding to the absorption edge and transmittance in the region that is about 10 to 20 nm larger than a wavelength with the maximum transmittance corresponding to the absorption edge (e.g., a distance between T %(300-310 nm) and T %(330-340 nm) for $TiO_2$).

Similarly, each of the second transmittances is a difference between the transmittance measured in a third predetermined region less than a minimum wavelength corresponding to the absorption edge of the second material of interest and the transmittance measured in a fourth predetermined region larger than a maximum wavelength corresponding to the absorption edge of the second material of interest.

Step S52: calculating an average ratio of the first transmittances to the second bare transmittances as one of the plurality of first quality values Q1, and calculating an average ratio of the second transmittances to the second bare transmittances as one of the plurality of second quality values Q2.

Figure 20:
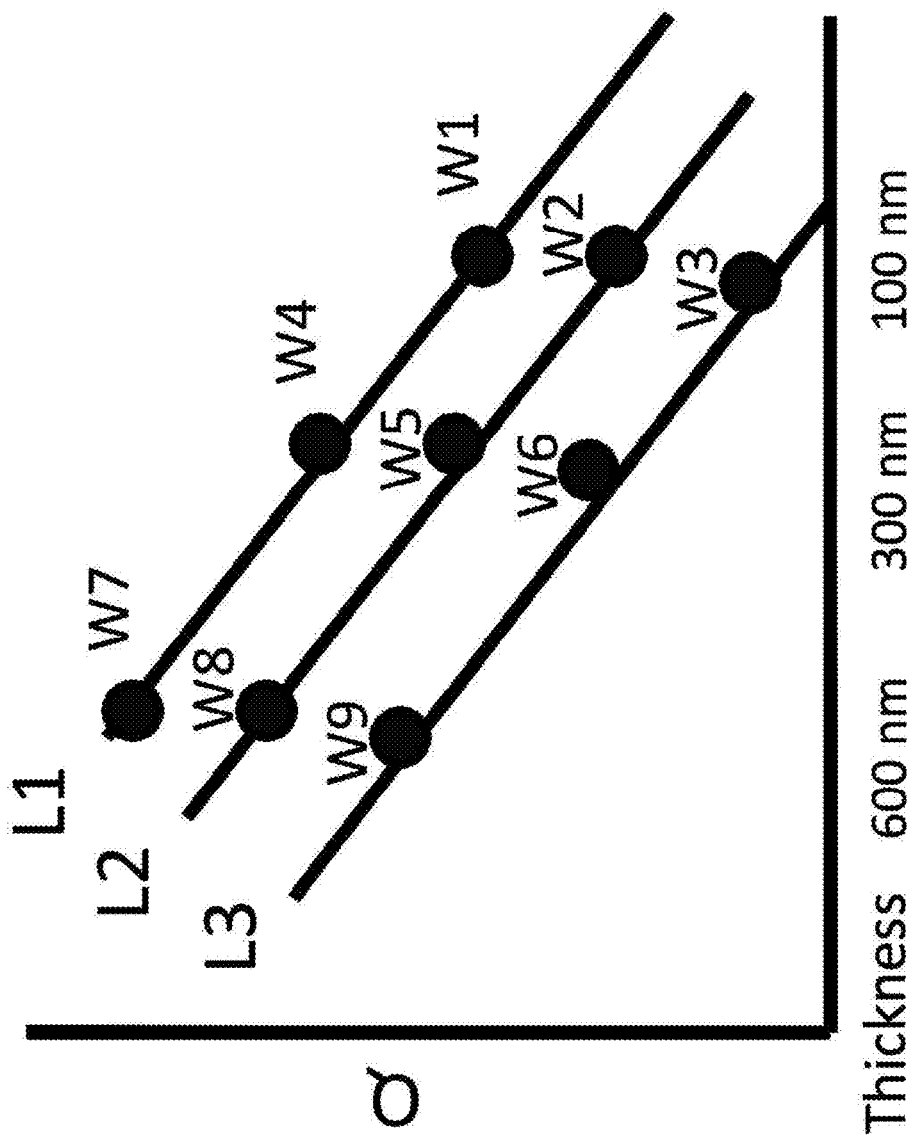
FIG. 20 is a plot diagram showing calibration functions of the second thickness for the first, second and third reference thicknesses, respectively, corresponding to the plurality of second quality values and the plurality of first and second thicknesses.

The inspection method further proceeds to Step S215: applying linear approximations to obtain a plurality of calibration functions of the second thickness for the first, second and third reference thicknesses, respectively, according to the plurality of second quality values and the plurality of first and second thicknesses. As shown in FIG. 20.

FIG. 20 is a plot diagram showing calibration functions of the second thickness for the first, second and third reference thicknesses, respectively, corresponding to the plurality of second quality values and the plurality of first and second thicknesses.

Step S216: measuring a transmittance of the test bare portion, to obtain the test bare transmittance of the test bare portion at the second region of wavelength.

Figure 21:
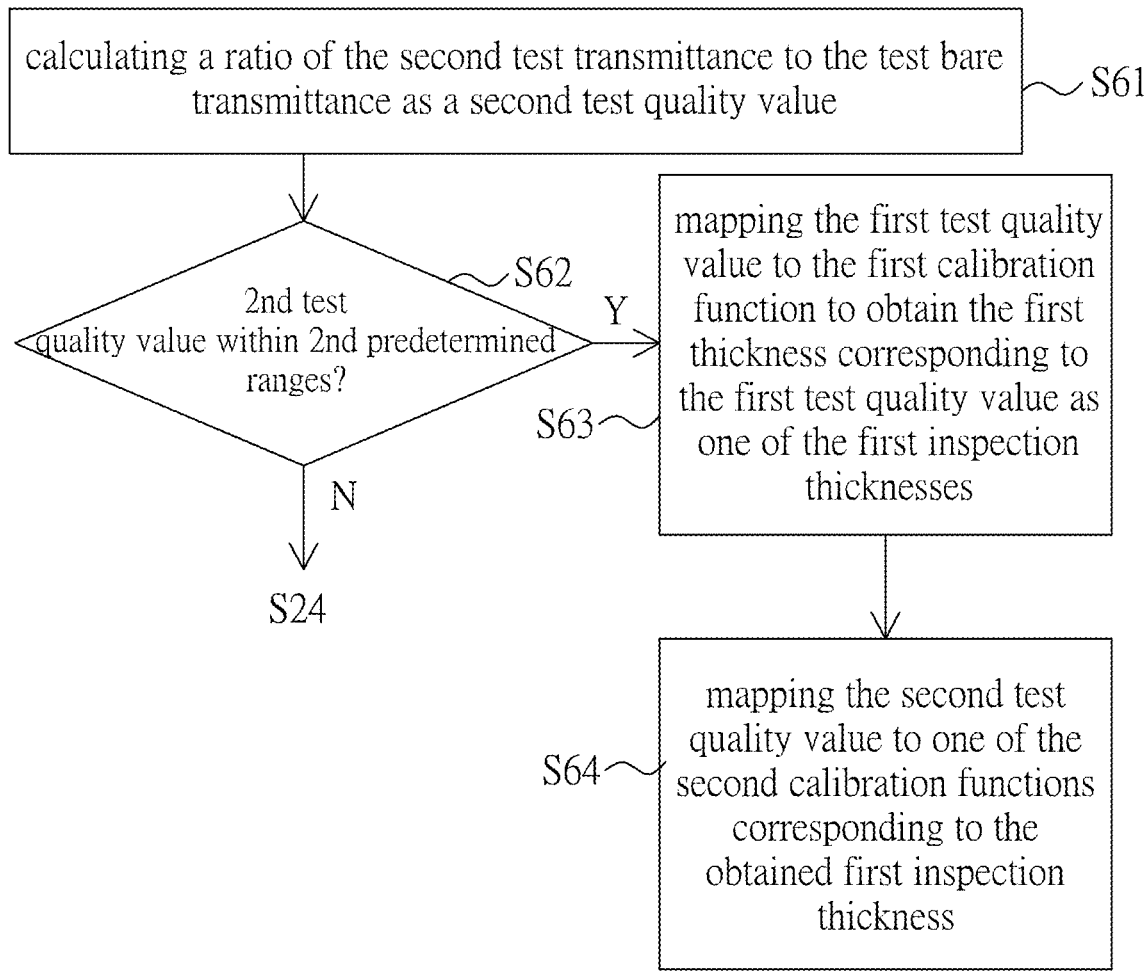
FIG. 21 shows another flowchart of the inspection process according to the second embodiment.

Step S217: performing the inspection process for each of the plurality of test points in the test covered portion of the test sample to obtain a plurality of second inspection thicknesses. FIG. 21 is another flowchart of the inspection process according to the second embodiment of the present disclosure. The inspection process further includes:

Step S61: calculating a ratio of the second test transmittance to the test bare transmittance as a second test quality value.

Step S62: determining whether the test second quality value is within a second predetermined range.

If the first and second test quality values are within the first predetermined range and the second predetermined range, respectively, the inspection process proceeds to step S63: mapping the first test quality value to the first calibration function to obtain the first thickness corresponding to the first test quality value as one of the first inspection thicknesses. Otherwise the inspection proceeds to step S24 mentioned above.

Step S64: mapping the second test quality value to one of the second calibration functions corresponding to the obtained second inspection thickness, thereby obtaining the second thickness corresponding to the second test quality value as one of the second inspection thickness.

After the first inspection thicknesses and the second inspection thicknesses are obtained, the method proceeds to step S211 mentioned above.

In conclusion, the inspection method for the multilayer semiconductor device provided by the present disclosure can investigate multilayered ensembles of the semiconductor device, and obtain stratigraphic thickness (ST) maps of each layer in the multilayer semiconductor device that can be used to measure uniformity of an interface between two layers in ensembles and thicknesses of separate layers by using calibration functions, detect missing layer(s), find dust particles on the surface and inside the ensembles, detect and locate parasitic phases, absorption edges in the spectral curves are not affected by the optical interference effects.

Furthermore, by utilizing absorption edges of materials of interest, precise measurements for extremely thin films (~10 nm) can be achieved, the calibration function for a specific layer can be used for another substrate, and since small shifts in absorption edges can be detected, compositional analysis can then be performed.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. An inspection method for a multilayer semiconductor device, comprising:
  preparing a test sample of the multilayer semiconductor device including:
    a test substrate including a test covered portion and a test bare portion; and
    a first test layer disposed on the test substrate in the test covered portion, wherein the first test layer is made of a first material of interest;
  preparing a plurality of first reference samples, wherein each of the plurality of first reference samples includes:
    a first reference substrate having a first covered portion and a first bare portion; and
    a first layer disposed on the first reference substrate in the first covered portion, wherein the first layer is made of the first material of interest;
  choosing a first region of wavelength corresponding to an absorption edge of the first material of interest;
  performing a first calibration process for each of the first reference samples to obtain a plurality of first quality values and a plurality of first thicknesses corresponding to the plurality of first quality values, wherein the first calibration process includes:
    measuring a thickness of the first layer as one of the plurality of first thickness;
    measuring transmittances of the first covered portion and the first bare portion with a light source emitting lights at the first region of wavelength, to obtain first transmittances of the first covered portion and first bare transmittances of the first bare portion; and
    calculating an average ratio of the first transmittances to the first bare transmittances as one of the plurality of first quality values;
  applying a linear approximation to obtain a first calibration function of the first thickness according to the plurality of first quality values and the plurality of first thicknesses;

measuring a transmittance of the test bare portion of the test sample, to obtain a test bare transmittance of the test bare portion at the first region of wavelength; and performing an inspection process for each of a plurality of test points in the test covered portion of the test sample to obtain a plurality of first inspection thicknesses, wherein the inspection process includes:

measuring a transmittance of the test covered portion with the light source emitting lights at the first region of wavelength, to obtain a first test transmittance of the test covered portion;

calculating a ratio of the first test transmittance to the test bare transmittance as a first test quality value;

determining whether the test first quality value within a first predetermined range; and in response to the first test quality value being determined within the first predetermined range, mapping the first test quality value to the first calibration function to obtain the first thickness corresponding to the first test quality value as one of the first inspection thicknesses.

2. The inspection method according to claim 1, wherein the first region of wavelength is chosen in a predetermined region less than a minimum wavelength in a transmittance spectrum corresponding to the absorption edge of the first material of interest.

3. The inspection method according to claim 1, wherein the inspection process further includes:

in response to the first test quality value being determined not within the first predetermined range, measuring transmittances of the test covered portion with the light source emitting lights at wavelengths in a full spectrum, to obtain a transmittance spectrum of the corresponding test point; and determining whether the absorption edge of the first material of interest absents in the transmittance spectrum, wherein the first predetermined range is determined according to an average of the plurality of first test quality value.

4. The inspection method according to claim 1, wherein the test sample of the multilayer semiconductor further includes a second test layer disposed on the first test layer in the test covered portion, wherein the second test layer is made of a second material of interest different from the first material of interest.

5. The inspection method according to claim 4, further comprising:

measuring transmittances of the test covered portion at wavelengths in a full spectrum, to obtain a transmittance spectrum of the test covered portion; and determining whether absorption edges of the first material of interest and the second material of interest are clearly distinguishable.

6. The inspection method according to claim 5, further comprising:

in response to absorption edges of the first material of interest and the second material of interest being determined to be clearly distinguishable, preparing a plurality of second reference samples, wherein each of the plurality of second reference samples includes:

a second reference substrate having a second covered portion and a second bare portion;

a first sublayer disposed on the second reference substrate in the second covered portion, wherein the first sublayer is made of the first material of interest, and the first sublayers of the plurality of second reference samples have same thicknesses, respectively; and a second sublayer disposed on the first sublayer in the second covered portion, wherein the second sublayer is made of a second material of interest, and the second sublayers of the plurality of second reference samples have different thicknesses, respectively.

7. The inspection method according to claim 6, further comprising:

choosing a second region of wavelength corresponding to the absorption edge for the second material of interest;

performing a second calibration process for each of the second reference samples to obtain a plurality of second quality values and a plurality of second thicknesses corresponding to the plurality of second quality values, wherein the second calibration process includes:

measuring a thickness of the second sublayer as one of the plurality of second thickness;

measuring transmittances of the second covered portion and the second bare portion with a light source emitting lights at the second region of wavelength, to obtain second transmittances of the second covered portion and second bare transmittances of the second bare portion; and calculating an average ratio of the second transmittances to the second bare transmittances as one of the plurality of second quality values; and applying a linear approximation to obtain a second calibration function of the second thickness according to the plurality of second quality values and the plurality of second thicknesses.

8. The inspection method according to claim 7, wherein the inspection process further includes:

measuring a transmittance with the light source emitting lights at the second region of wavelength, to obtain a second test transmittance of the test covered portion;

calculating a ratio of the second test transmittance to the test bare transmittance as a second test quality value;

determining whether the second test quality value within a second predetermined range; and in response to the test quality value being determined within the second predetermined range, mapping the second test quality value to the second calibration function to obtain the second thickness corresponding to the second test quality value as one of the second inspection thicknesses.

9. The inspection method according to claim 8, wherein the first region of wavelength is chosen in a first predetermined region less than a minimum wavelength in a transmittance spectrum corresponding to the absorption edge of the first material of interest, and the second region of wavelength is chosen in a second predetermined region less than a minimum wavelength in a transmittance spectrum corresponding to the absorption edge of the second material of interest.

10. The inspection method according to claim 8, wherein the inspection process further includes:

in response to the second test quality value being determined not within the second predetermined range, measuring transmittances of the test covered portion with the light source emitting lights at wavelengths in a full spectrum, to obtain a transmittance spectrum of the corresponding test point; and determining whether the absorption edges of the first and second material of interest absent in the transmittance spectrum, wherein the first predetermined range is determined according to an average of the plurality of first test quality value, and the second predetermined range predetermined range is determined according to an average of the plurality of second test quality value.

11. The inspection method according to claim 5, further comprising:
in response to absorption edges of the first material of interest and the second material of interest being determined to be clearly distinguishable, wherein each of the first reference sample further includes:
a second layer disposed on the first layer in the first covered portion, wherein the second layer is made of the second material of interest, and the plurality of first reference samples at least includes:
a first set of reference samples including the first layers each having a first reference thickness;
a second set of reference samples including the first layers each having a second reference thickness; and
a third set of reference samples including the first layers each having a third reference thickness, wherein each of the first set, the second set and the third set of reference samples includes the second layers having a fourth reference thickness, a fifth reference thickness and a sixth reference thickness, respectively.

12. The inspection method according to claim 11, further comprising:
choosing a second region of wavelength corresponding to the absorption edge for the second material of interest;
performing the first calibration process for each of the first reference samples to further obtain the plurality of second quality values and a plurality of second thicknesses corresponding to the plurality of second quality values, wherein the first calibration process further includes:
measuring a thickness of the second layer as one of the plurality of second thickness;
measuring transmittances of the first covered portion and the first bare portion with a light source emitting lights at the second region of wavelength, to obtain second transmittances of the first covered portion and second bare transmittances of the first bare portion; and
calculating an average ratio of the second transmittances to the second bare transmittances as one of the plurality of second quality values; and
applying linear approximations to obtain a plurality of calibration functions of the second thickness for the first, second and third reference thicknesses, respectively, according to the plurality of second quality values and the plurality of first and second thicknesses.

13. The inspection method according to claim 12, wherein each of the first transmittances is a difference between the transmittance measured in a first predetermined region less than a minimum wavelength corresponding to the absorption edge of the first material of interest and the transmittance measured in a second predetermined region larger than a maximum wavelength corresponding to the absorption edge of the first material of interest, and
wherein each of the second transmittances is a difference between the transmittance measured in a third predetermined region less than a minimum wavelength corresponding to the absorption edge of the second material of interest and the transmittance measured in a fourth predetermined region larger than a maximum wavelength corresponding to the absorption edge of the second material of interest.

14. The inspection method according to claim 12, further comprising:
measuring a transmittance of the test bare portion, to obtain the test bare transmittance of the test bare portion at the second region of wavelength;
performing the inspection process for each of the plurality of test points in the test covered portion of the test sample to obtain a plurality of second inspection thicknesses, wherein the inspection process further includes:
calculating a ratio of the second test transmittance to the test bare transmittance as a second test quality value;
determining whether the test second quality value within a second predetermined range; and
in response to the first and second test quality values being determined within the first predetermined range and the second predetermined range, respectively, mapping the first test quality value to the first calibration function to obtain the first thickness corresponding to the first test quality value as one of the first inspection thicknesses; and
mapping the second test quality value to one of the second calibration functions corresponding to the obtained first inspection thickness, thereby obtaining the second thickness corresponding to the second test quality value as one of the second inspection thickness.

15. The inspection method according to claim 14, wherein the inspection process further includes:
in response to the first test quality value being determined not within the first predetermined range or the second test quality value being determined not within the second predetermined range, measuring transmittances of the test covered portion with the light source emitting lights at wavelengths in a full spectrum, to obtain a transmittance spectrum of the corresponding test point; and
determining whether the absorption edges of the first and second material of interest absent in the transmittance spectrum,
wherein the first predetermined range is determined according to an average of the plurality of first test quality value, and the second predetermined range predetermined range is determined according to an average of the plurality of second test quality value.

16. The inspection method according to claim 1, further comprising using a computing device and an X-Y table with a stepper motor to perform the inspection process on each of the plurality of test points scattered in the test covered portion, thereby obtaining a stratigraphic thickness (ST) maps of each layer in the semiconductor device.

17. The inspection method according to claim 1, wherein the test covered portion and the test bare portion of the test sample is physically separated and individually prepared.

* * * * *